United States Patent [19]
Sato et al.

[11] Patent Number: 4,929,893
[45] Date of Patent: May 29, 1990

[54] WAFER PROBER

[75] Inventors: Mitsuya Sato; Takao Ukaji; Nobuhito Yamaguchi; Taro Ohmori; Eiichi Murakami, all of Yokohama, Japan

[73] Assignee: Canon Kabushiki Kaisha, Tokyo, Japan

[21] Appl. No.: 252,997

[22] Filed: Oct. 4, 1988

[30] Foreign Application Priority Data

Oct. 6, 1987 [JP] Japan ................................ 62-252822
Oct. 31, 1987 [JP] Japan ................................ 62-276341

[51] Int. Cl.$^5$ ..................... G01R 31/02; G01R 1/06; G06K 9/00
[52] U.S. Cl. ..................... 324/158 F; 358/101; 382/8; 356/401
[58] Field of Search ........... 324/158 F, 158 P, 73 PC, 324/158 R, 73 R; 33/533, 557; 364/552, 559; 358/101, 106; 382/8; 356/401, 400

[56] References Cited

U.S. PATENT DOCUMENTS

| | | | |
|---|---|---|---|
| 4,677,474 | 6/1987 | Sato et al. | 324/158 P |
| 4,692,800 | 9/1987 | Yoshida | 358/101 |
| 4,757,550 | 7/1988 | Uga | 382/8 |
| 4,780,617 | 10/1988 | Umatate et al. | 364/559 |
| 4,786,867 | 11/1988 | Yamatsu | 324/158 F |
| 4,794,648 | 12/1988 | Ayata et al. | 356/401 |
| 4,864,227 | 9/1989 | Sato | 324/158 F |

Primary Examiner—Reinhard J. Eisenzopf
Assistant Examiner—Vinh P. Nguyen
Attorney, Agent, or Firm—Morgan & Finnegan

[57] ABSTRACT

A wafer prober usable with a probe card for examination of chips formed on a wafer is disclosed. The wafer prober has a function for automatically aligning bonding pads of each chip with probe needles of the probe card. The prober includes a contact plate movable in X and Y directions with a wafer chuck. The contact blade is pressed against at least one of the tips of the probe needles, and the thus contacted needle tip is observed by a TV camera from the underneath of the contact plate. The video signal obtained thereby is used for the alignment between the bonding pads and the probe needles. Also, the TV camera is moved in the X and Y directions with the wafer chuck to allow that one and the same reference mark is observed by this TV camera and by another TV camera provided for image-taking the bonding pads. With the proposed structure, the bonding pads and the probe needles can be aligned automatically and accurately.

14 Claims, 17 Drawing Sheets

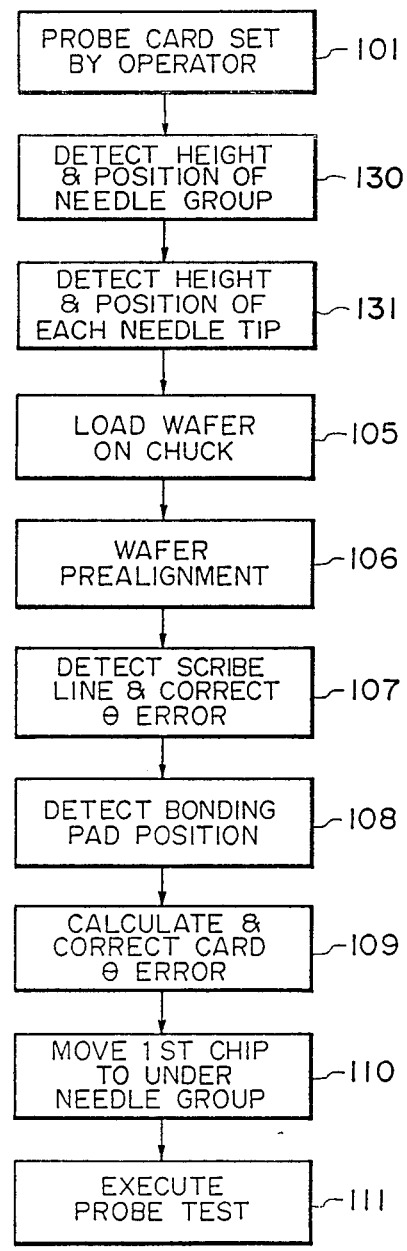
F I G. 12

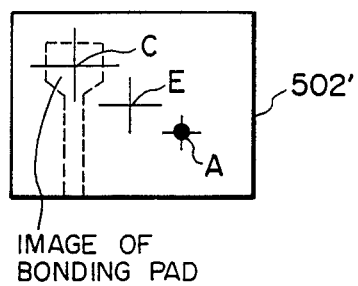
IMAGE OF
BONDING PAD
F I G. 15A
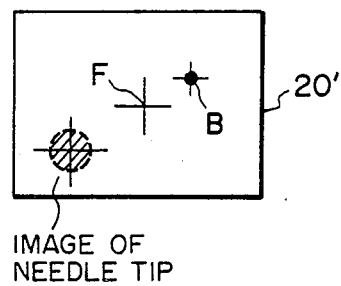
IMAGE OF
NEEDLE TIP
F I G. 15B
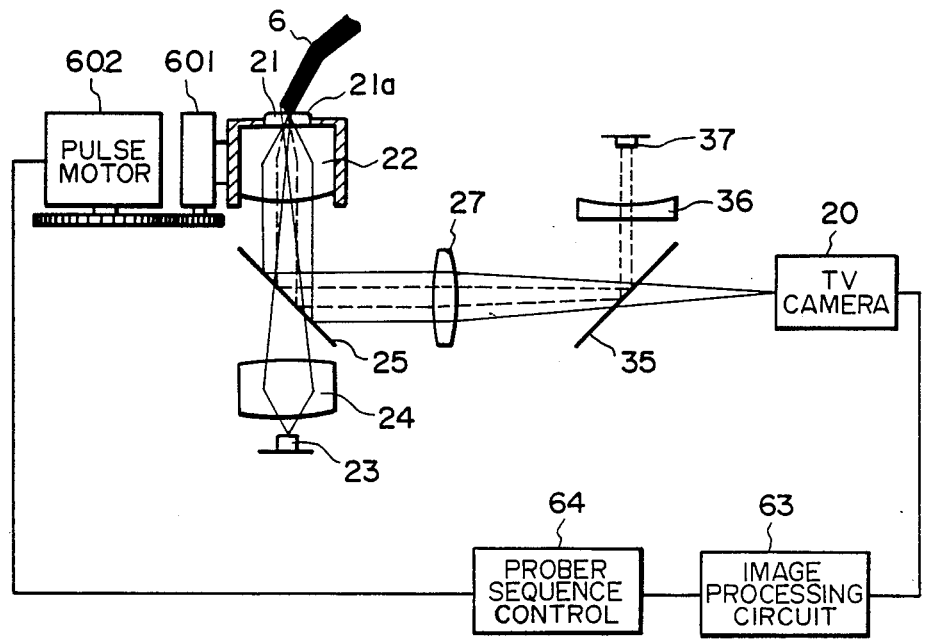
F I G. 16

WAFER PROBER

FIELD OF THE INVENTION AND RELATED ART

This invention relates to a wafer prober for use in the probe examination of semiconductor chips and, more particularly, to a wafer prober having a function for automatically aligning bonding pads of a semiconductor chip with probe needles of a probe card.

The wafer prober is an apparatus which is used in the measurement of characteristics of each of a number of IC chips formed on a semiconductor wafer.

Actual examination is carried out by an apparatus called an "IC tester", and the wafer prober is used to provide a correct electrical contact between the IC tester and each IC chip on the wafer. The electrical contact is correctly established through a printed board, called a "probe card", which is provided with a plurality of contact needles (probe needles) corresponding to the positions of the bonding pads of each IC chip.

In conventional wafer probers, after a probe card is set in the wafer prober, the following operations are necessarily made to allow that the position of a probe needle group with respect to X, Y and Z directions is inputted into a control unit of the wafer prober: namely, a wafer which is the subject of actual examination is placed under the probe card, and, thereafter, the tips of the probe needles of the probe card and the bonding pads of an IC chip on the wafer are relatively aligned with respect to four axial directions (X, Y, $\theta$ and Z directions) through the manual operation by an operator.

This needle-to-pad alignment is effected while the operator observes the probe needle tips by use of a stereomicroscope. For the alignment with respect to the $\theta$ direction, the operator rotationally moves the probe card. For the alignment with respect to the X and Y directions, the operator displaces the wafer after the $\theta$ direction alignment so that the bonding pads of the IC chip are placed exactly under the probe needles. For the alignment with respect to the Z direction (i.e. height adjustment), the operator actually moves the wafer upwardly so that it contacts the probe needles. In this manner, the alignment is completed.

SUMMARY OF THE INVENTION

It is seen from the foregoing that the alignment requires very cumbersome and time-consuming works. Additionally, in these works, the precision of the probe card setting is determined by the skill of the operator. This is one of the factors which make the IC chip examination unstable.

Naturally, automatic probe card alignment is particularly desired. Although many proposals have been made in this respect, there are various limiting conditions such as described below and none of the proposals has achieved the automatic alignment that satisfies all of these conditions. The conditions are:

(1) The position of the tip of each probe needle which is being deformed by the press contact and which has a very light stylus pressure (e.g. about 10 g) must be detected exactly.

(2) Contamination of probe needle tips must be prevented.

(3) Electric short-circuit between probe needles must be prevented.

(4) The possibility that the needle tip position is detected without applying an electric signal to each probe needle, because it is electrically connected to the tester side.

(5) The possibility that the needle tip position is detected with certainty, independently of the shape of the probe needle tip.

(6) Only a least number of consumable parts is required.

(7) The possibility of high-speed position detection.

(8) The structure should be small in size and light in weight.

(9) The manufacturing cost should be low.

In consideration of the foregoing, it is an object of the present invention to provide a wafer prober by which the probe card alignment in respect to the X, Y, $\theta$ and Z directions, which has been conventionally made manually by an operator, can be made automatically while satisfying the above-described conditions (1) to (9).

In accordance with one aspect of the present invention to achieve the above object, there is provided a wafer prober which includes: a contact plate which is movable as a unit with a wafer chuck by means of an X-Y stage; means which allows the contact plate to be automatically pressed against at least one of the tips of a probe needle group formed on a probe card; and image pickup means for image-taking at least one of the tips of the probe needle group being press-contacted by the contact plate. The alignment control is made on the basis of video signals from the image pickup means, to achieve the alignment between the probe card, set in the prober, and a wafer held by the wafer chuck.

In accordance with another aspect of the present invention, also to achieve the above object, there is provided a wafer prober of the type wherein a wafer is held on a wafer chuck which is movable in X and Y directions by means of an X-Y stage and wherein, as the wafer is moved by the X-Y stage, bonding pad groups of the chips on the wafer are sequentially contacted to a probe needle group of a probe card, an important feature lying in that the prober is provided with first image pickup means for image-taking the wafer for measurement of the position of a bonding pad, second image pickup means for image-taking a probe needle for measurement of the position of a probe needle tip, and reference forming means for forming a reference for the measurement which reference can be image-taken by at least one of the first and second image pickup means.

With a wafer prober according to the present invention, the site of the tips of a probe needle group of a probe card can be measured automatically while satisfying the above-described conditions (1) to (9). In a wafer prober of the present invention, a first image pickup means is used to pick up an image of a chip (bonding pads) on a wafer and, on the basis of a video signal obtained, the site of a bonding pad group is measured. Also, a second image pickup means is used to pick up an image of the probe needle group and, on the basis of a video signal obtained, the site of the probe needle tips is measured. In a wafer prober of the present invention, an image of a reference formed by a reference forming means (e.g. a mark element provided at a predetermined position in the wafer prober, a light beam spot or otherwise) may be picked up by at least one of the first and second image pickup means, and the thus image-picked reference may be used as an origin for the site of the bonding pads and the site of the probe needles. This allows that one and the same reference is used as an origin for the measurement of the site of the bonding pads and the site of the probe needles even when separate plural image pickup means are used for the respective measurements. This effectively prevents that, where at least one of the first and second image pickup means (objective optics, TV cameras or otherwise) is deviated from a predetermined fixation point (at which it should be fixed) because of something such as a change with aging, for example, such a deviation adversely affects the alignment between the bonding pad group and probe needle group.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 12 is a flow chart showing the operations made in the FIG. 9 embodiment.

FIGS. 15A and 15B are schematic views, respectively, showing pictures taken by the image pickup systems of the FIG. 14 example.

FIG. 16 is a schematic and diagrammatic view showing the manner of probe needle tip detection in the FIG. 13 embodiment.

DESCRIPTION OF THE PREFERRED EMBODIMENTS

Figure 1:
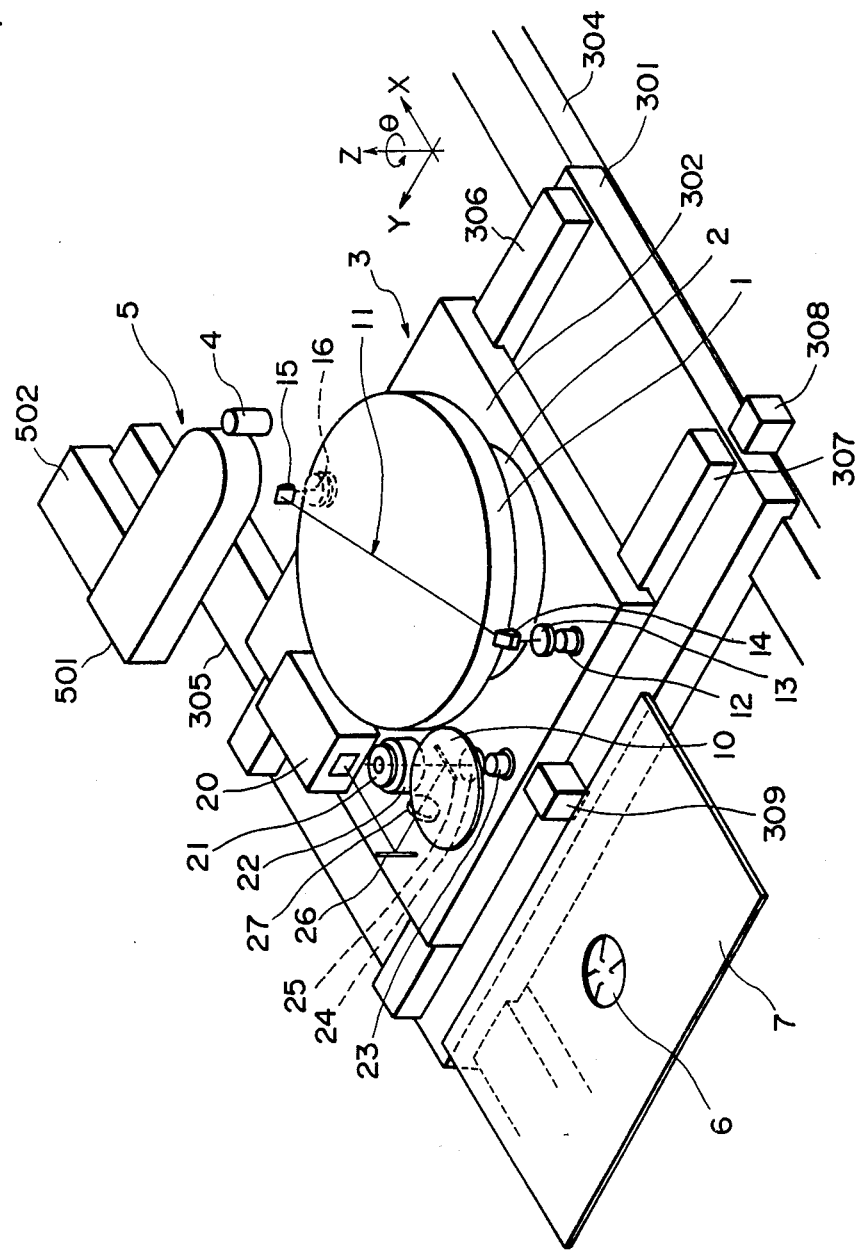
FIG. 1 is a perspective view schematically showing a wafer prober according to one embodiment of the present invention.

Referring first to FIG. 1 which schematically shows an upper portion of a wafer prober according to one embodiment of the present invention, denoted at 1 is a wafer chuck for carrying thereon a wafer; at 2, a $\theta$-Z stage adapted to move the wafer chuck 1 in the $\theta$ and Z directions; and at 3, an X-Y stage which is adapted to move the $\theta$-Z stage 2 in the X and Y directions and which comprises an X-axis stage 301 and a Y-axis stage 302. The X-axis stage 301 is movable while being guided by guides 304 and 305 which are fixedly supported by a base member, not shown. The Y-axis stage 302 is movable while being guided by guides 306 and 307 which are fixedly supported by the X-axis stage 301. Denoted at 308 is a position detector for detecting the position of the X-axis stage 301 in the X direction, by use of a scale (not shown). Denoted at 309 is another position detector for detecting the position of the Y-axis stage 302 in the Y direction, by use of a scale (not shown).

Denoted at 4 is a capacitance type sensor for measuring the outer configuration of a wafer as well as the position (height) of the wafer in the Z direction; and at 5, an image pickup device for image-taking the pattern of an IC chip on the wafer, the image pickup device including a microscope 501 and a TV camera 502.

Denoted generally by a reference numeral 6 are probe needles which are operable to provide electric contact with bonding pads of each IC chip (in FIG. 1, only four outermost ones of a number of probe needles being illustrated). Denoted at 7 is a probe card (printed board) on which the probe needles 6 are arrayed and fixedly mounted to assure that the tips of the probe needles 6 correspond, in a one-to-one relationship, to the bonding pads (in a group) which are arrayed on each IC chip in a predetermined state. The probe card 7 is held, in this embodiment, by vacuum suction by means of a holder such as shown at 701 in FIG. 6.

Denoted at 10 is a touch plate which is used to detect a minute load when it is pressed by the needle tip group of the probe needles 6 in the Z direction, from the above, to thereby measure the height of the needle tip group of the probe needles 6. In this embodiment, the touch plate 10 comprises a thin plate member made of a material such as quartz, sapphire or otherwise.

Denoted at 11 is a laser beam which is used to detect the approximate position of the needle tip group of the probe needles 6; at 12, a semiconductor laser which produces the laser beam 11; at 13, a condensing lens for concentrating the laser beam 11 at a central portion of the wafer chuck 1; at 14, a prism for deflecting the laser beam 11 from the semiconductor laser 12 so that the laser beam advances in parallel to the upper surface of the wafer chuck 1; and at 15, another prism for directing the laser beam 11, being projected along the upper surface of the wafer chuck 1, to a light receiving element 16 which is provided for the laser beam detection.

Denoted at 20 is a TV camera for image-taking, through an objective lens 22, a tip of a probe needle 6 being press contacted to a contact plate 21, for measurement of the position of the tip of the probe needle 6. The TV camera 20 is provided on the Y-axis stage 302. In this embodiment, the objective lens 22 is provided by what is called an "infinite correction lens" by which a light flux from an object point at a focus position can be emitted in the form of a parallel light. Denoted at 23 is a light source for illuminating the tip of the probe needle 6. For example, the light source 23 may comprise a heterojunction type high-luminance light emitting diode (LED). The light source 23, the condensing lens 24 and a half mirror 25 cooperate to provide an illumination system. The contact plate 21 has an outer peripheral portion 21a which is tapered so as to prevent that, when the tip of a probe needle 6 is pressed against thereto, the needle tip shifts outwardly to the side face of the contact plate 21. Denoted at 27 is a relay lens for imaging, through a mirror 26, the parallel light from the objective lens 22 upon the image pickup surface of the TV camera 20.

Figure 2:
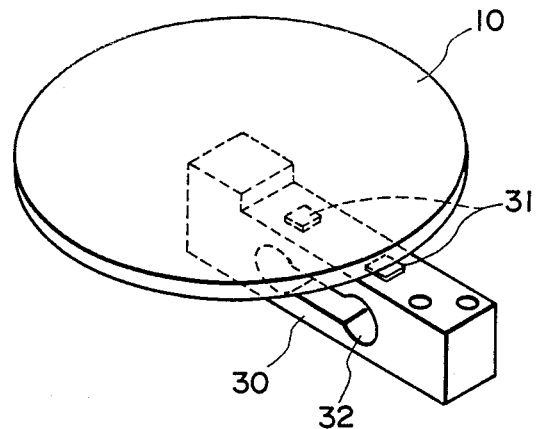
FIG. 2 is a perspective view schematically showing a touch plate usable in the FIG. 1 embodiment for detecting the site of probe needle tips with respect to the Z direction.
Figure 3:
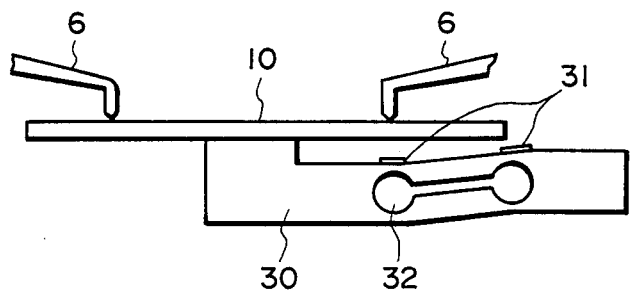
FIG. 3 is a schematic view illustrating the action of the touch plate of the FIG. 2 example.

FIG. 2 shows in detail the structure for detecting the position in the Z direction (i.e. height) of the needle tip group of the probe needles 6 by use of the touch plate 10. Denoted at 30 in FIG. 2 is a deformable member which is made of a material such as Duralumin or otherwise and which is supported approximately at the center thereof. At a side of the deformable member 30, a throughbore 32 of the illustrated shape is formed to allow that the member 30 easily deforms by the load applied thereto when the tips of the probe needles 6 are pressed to the touch plate 10, as shown in FIG. 3. Denoted at 31 is semiconductor strain gauges for detecting the amount of deformation of the deformable member 30. Each gauge 31 is fixed to the deformable member 30 in the manner that it is positioned above (in the Z direction) the throughbore 32.

Figure 4:
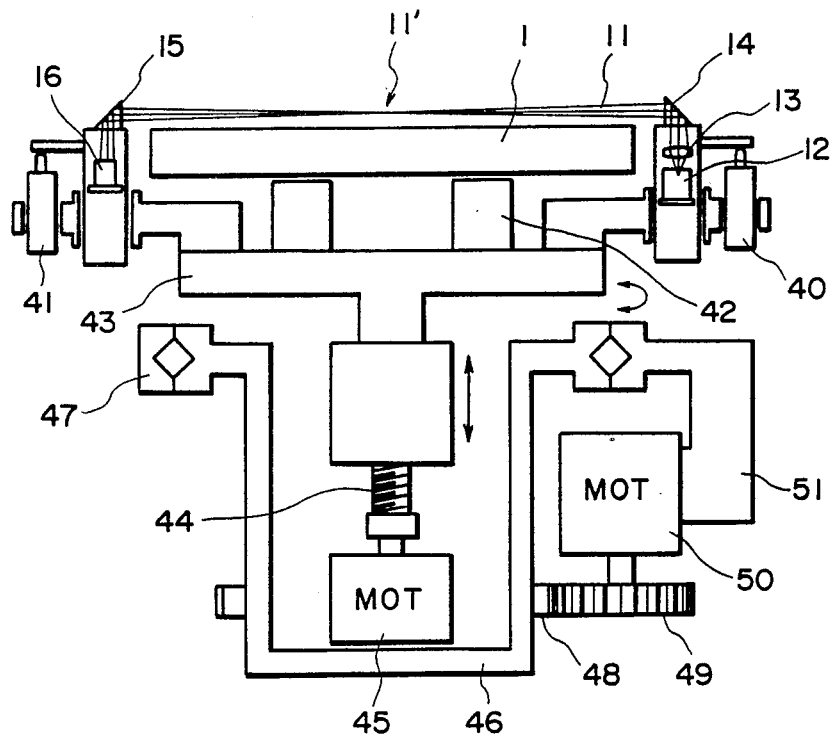
FIG. 4 is a schematic section showing the structure of a wafer chuck.

FIG. 4 shows in detail the structure for roughly detecting the position of the needle tip group of the probe needles 6 in an X-Y coordinate, by using the laser beam 11. Denoted at 40 in FIG. 4 is a linear solenoid for displacing, as a unit, the semiconductor laser 12, the condensing lens 13 and the prism 14 relatively to the wafer chuck 1; at 41, another linear solenoid for displacing, as a unit, the light receiving element 16 and the prism 15 relatively to the wafer chuck 1; at 42, an insulating material for supporting the wafer chuck 1 in a state in which the chuck 1 is electrically isolated from a Z-axis stage 43; at 44, a ball screw; and at 45, a pulse motor for displacing the Z-axis stage 43 in the Z direction relatively to a θ stage 46, by rotating the ball screw 44. The pulse motor 45 is supported, together with the other driving mechanisms such as the ball screw 44, within the θ stage 46. Denoted at 47 is a bearing assembly for supporting the θ stage 46 rotatably relatively to a stationary portion 51 of the major assembly of the apparatus; at 48, a gear which is mounted to the peripheral surface of the θ stage 46 so that its center of rotation agrees with the center of rotation of the θ stage 46; at 49, a gear engaging with the gear 48; and at 50, a pulse motor for rotating the θ stage 46 through the gears 48 and 49. The pulse motor 50 is supported by the stationary portion 51. With the described arrangement, the laser beam 11 can be shifted upwardly/downwardly in the Z direction and rotationally in the θ direction as a unit with the wafer chuck 1. Additionally, the laser beam 11 can be shifted upwardly/downwardly in the Z direction relatively to the wafer chuck 1.

Figure 5:
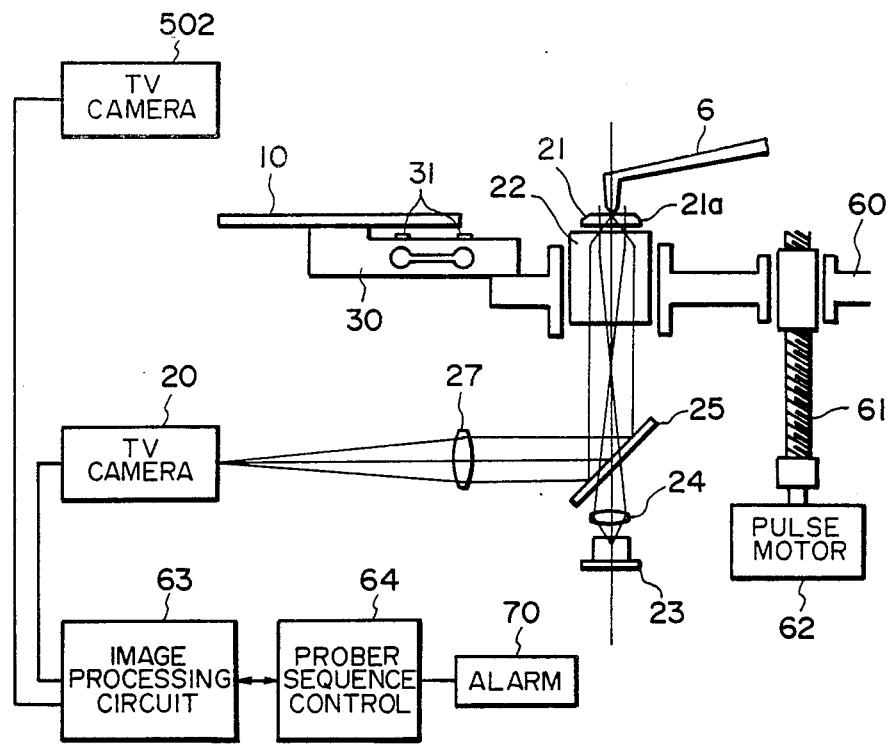
FIG. 5 is a schematic and diagrammatic view of an image pickup system usable for image-taking a probe needle tip group.

FIG. 5 shows in detail the structure for detecting the position of each of the grouped needle tips of the probe needles 6 by using the TV camera 20. Denoted at 60 in FIG. 5 is a holder arm for fixedly supporting the contact plate 21 and the objective lens 22 as a unit. To an end of the holder arm 60, the deformable member 30 which supports the touch plate 10 is mounted. Denoted at 61 is a ball screw, and at 62 is a pulse motor for displacing the holder arm 60 in the Z direction by rotating the ball screw 61. Denoted at 63 is an image processing circuit of well-known type which is adapted to receive video signals from the TV camera 20 for image-taking the tip of each probe needle 6 and another TV camera 502 (see FIG. 1) for image-taking each of bonding pads of IC chips on the wafer, and to execute various operations such as the binarizing of an inputted video image, the labeling and the characteristic extraction, for example, in accordance with the instructions supplied from a prober sequence controller 64. The prober sequence controller 64 operates to control the sequence of the prober as a whole, and also to control the automatic alignment operation for the probe needle tips and the bonding pads, in response to the supply, from the image processing circuit 63, of the positional information concerning the center of each probe needle tip and the positional information concerning the center of each bonding pad, corresponding thereto, of each IC chip on a wafer.

Figure 6:
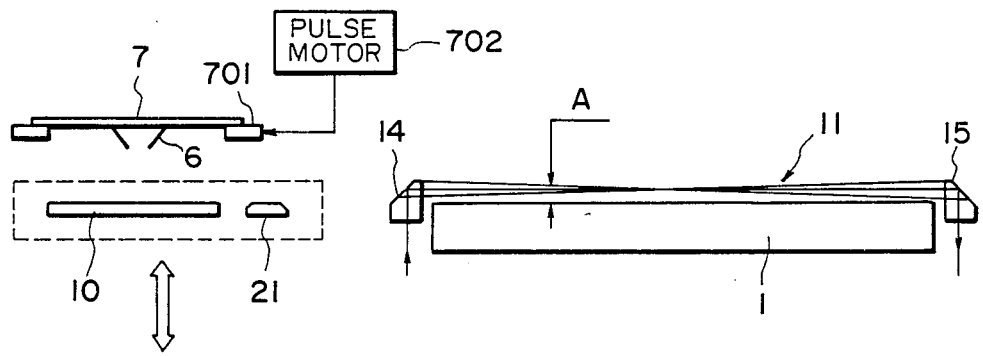
FIG. 6 is a schematic view explicating the positional relationship of various constituent elements with respect to the Z direction.

FIG. 6 schematically shows the positional relationship, with respect to the Z (height) direction, among the wafer chuck 1, probe needles 6, probe card 7, touch plate 10, laser beam 11 and contact plate 21. Denoted at 701 in FIG. 6 is a card holder for holding a probe card 7, and at 702 is a pulse motor for rotationally moving the card holder 701. It is seen in this Figure that the upper surface of the touch plate 10 and the upper surface of the contact plate 21 are maintained at the same height and that these plate members 10 and 21 are movable with each other in the Z direction (upwardly/downwardly) by means of the structure shown in FIG. 5. The optical axis for the laser beam 11 is defined to be spaced upwardly from the top of the wafer chuck 1 by a distance A (=2 mm) and in parallel to the upper surface of the wafer chuck 1. By the structure shown in FIG. 4, the optical axis for the laser beam 11 can be lowered downwardly of the upper surface of the wafer chuck 1.

Referring now to the flow chart of FIG. 10, the operation of the embodiment shown in FIG. 1 will be explained.

Figure 10:
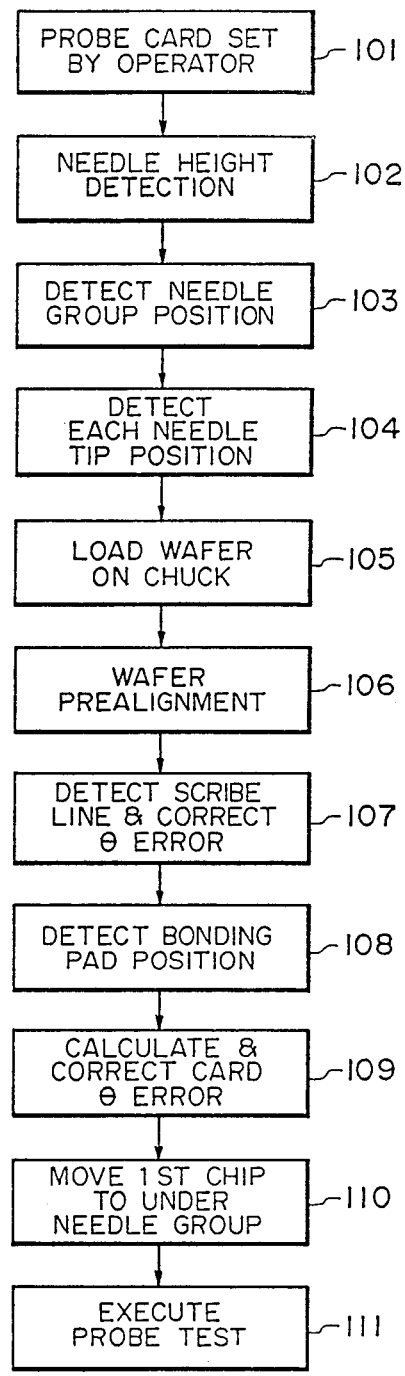
FIG. 10 is a flow chart showing the operations made in the FIG. 1 embodiment.

In the wafer prober of the FIG. 1 embodiment, first at step 101 in the flow chart of FIG. 10, a probe card 7 is set by an operator. Subsequently, when the operator depresses a switch on an operation panel (not shown), the X-Y stage 3 starts to move and the touch plate 10 supported on the X-Y stage 3 is placed below a needle tip group of probe needles 6 of the probe card 7. After this, at step 102, the rotation of the ball screw 61 by the pulse motor 62 shown in FIG. 5 starts, so that the touch plate 10 which is supported by the deformable member 30 gradually moves upwardly along the Z direction, together with the arm holder 60, until the upper surface of the touch plate 10 is brought into contact with some of the grouped needle tips of the probe needles 6. The controller 64 detects the height of the upper surface of the touch plate 10 at this time, on the basis of the number of pulses in the pulse signal train as having been applied to the pulse motor 62, and determines, from the detected height, the height (the position in the Z direction) of the needle tip group of the probe needles 6.

The structure for detecting the contact of the needle tip group of the probe needles 6 with the touch plate 10 is such as shown in FIG. 2, described hereinbefore. The component that supports the touch plate 10 is the deformable member 30 to the surface of which the semiconductor strain gauges 31 are attached. Such an arrangement provides a load sensor of what is called a "double-beam type". Usually, probe needles are used for the electrical examination in an "overdriven" state in which the probe needles has been relatively displaced by an additional distance of about 100 microns in the Z direction from such position at which the tips of the probe needles just contact the wafer surface. Also, in that state, a stylus pressure of an order of about 20 g will be applied to the wafer surface. In consideration of this, in the present embodiment, the threshold load for the discrimination of the contact of the needle tip group of probe needles with the touch plate 10, by the controller 64, may be set to approximately "2 g". As described hereinbefore, FIG. 3 shows a state in which load is applied to the touch plate 10 by the needle tip group of the probe needles 6. Since, in such a state, forces in a compressing direction and a tensioning direction are applied to the two semiconductor strain gauges 31, respectively, the resistances of these two gauges 31 change in a decreasing direction and an increasing direction, respectively. From the changes, the controller 64 detects the magnitude of the load.

If the contact of the needle tip group of the probe needles 6 with the touch plate 10 is not detected even as a result of the upward movement of the touch plate 10 through a predetermined stroke, the pulse motor 62 may be reversed to move the touch plate 10 downwardly and, additionally, the touch plate 10 may be displaced by the X-Y stage 3 by a predetermined distance in the neighborhood of the current position. After this, similar upward movement as described may be effected to execute again the detection of the height of the needle tip group of the probe needles 6.

Figure 7A:
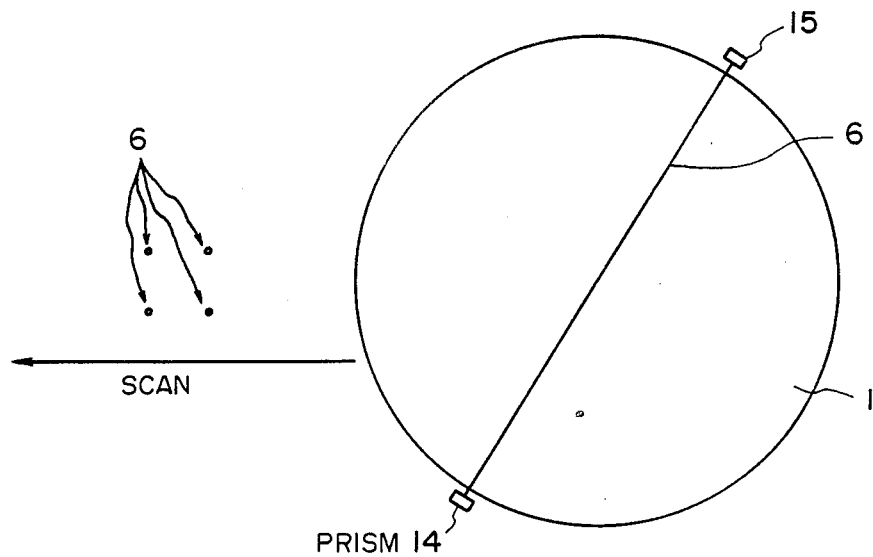
FIGS. 7A and 7B are schematic views, respectively, for explicating approximate position measurement, in an X-Y coordinate of probe needle tips by use of a laser beam.
Figure 7B:
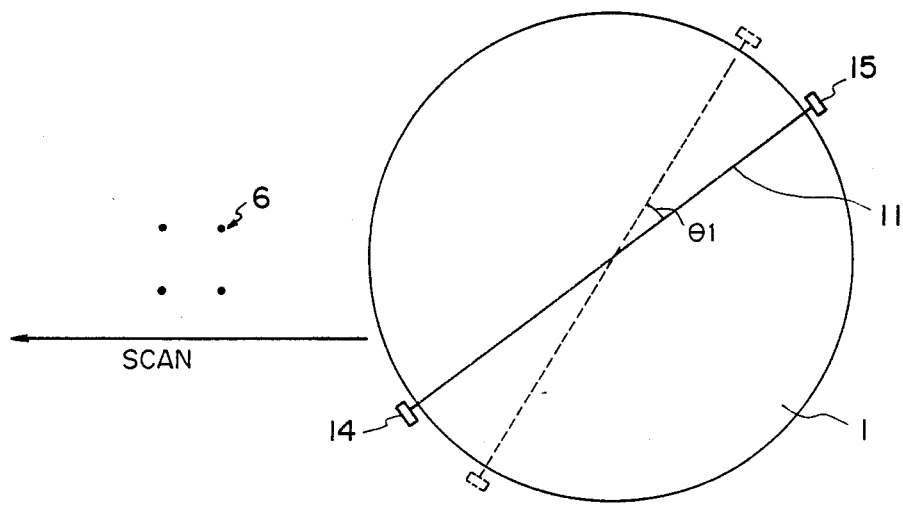

Next, for the approximate position measurement in an X-Y coordinate of the needle tip group of the probe needles 6 by using the laser beam 11 (at step 103 in FIG. 10), the linear solenoids 40 and 41 shown in FIG. 4 are actuated so as to displace, upwardly in the Z direction, the semiconductor laser 12, condensing lens 13, prism 14, prism 15 and light receiving element 16, such that the laser beam 11 is positioned above the upper surface of the wafer chuck 1 approximately by a clearance A (=2 mm). Also, in that state, the pulse motor 45 is actuated to move the Z-axis stage 43 upwardly in the Z direction so that the optical axis for the laser beam 11 is positioned upwardly, in the Z direction, of the height of the needle tip group of the probe needles 6 detected at step 102, approximately by a distance of about 100 microns. Also, at this time, the pulse motor 50 is actuated to rotationally displace the $\theta$ stage 46 so that the laser beam 11 is inclined with respect to the X-Y coordinate, in the manner such as shown in FIG. 7A, and the $\theta$ stage 46 is held in this state. Thereafter, as seen from FIG. 7A, the X-axis stage 301 is moved so that the point 11' of convergence of the laser beam 11 (which is substantially coincident with the center of the wafer chuck 1 with respect to the X-Y coordinate) passes across tips of probe needles 6. During this movement, the light quantity of the laser beam 11 directed through the prism 15 is monitored by the light receiving element 16, and the X-Y coordinate positions of those locations at each of which the detected light quantity is lower than a predetermined are detected by the controller 64, on the basis of the outputs of an X-axis position detector 308 and a Y-axis position detector 309, the detected positions being memorized in the controller. Subsequently, as illustrated in FIG. 7B, the inclination of the laser beam 11 with respect to the X-Y coordinate is changed by rotating the $\theta$ stage 46 through an angle $\theta 1$ by means of the pulse motor 50 and, thereafter, the $\theta$ stage 46 is held fixed. Then, in a similar manner as described, the X-Y coordinate positions of those locations at each of which the light quantity of the laser beam 11 incident on the light receiving element 16 is lower than a predetermined, are memorized. By the above-described operation, the positions of two straight lines (laser beams) passing through the right down tip and the left up tip of two probe needles 6, of those shown in FIG. 7A or 7B, are discriminated. Therefore, the controller 64 can determine the positions, in the X-Y coordinate, of the tips of the two probe needles 6, from equations of the point of intersection of the two straight lines.

However, the accuracy of the thus determined positions in the X-Y coordinate of the tips of the right down and left up probe needles 6 is not sufficient, in regard to the precision ($\pm 2$-3 microns) required for the probe examination. This is because each of the prisms 14 and 15 should be sized so that its upper portion does not abut against the bottom surface of the probe card 7, and therefore the effective numerical aperture (NA) of the condensing lens 13 can not be made so large, which results in the difficulty of decreasing the beam waist diameter of the laser beam 11 sufficiently. Also, as described, usually the electrical examination is executed with the probe needles 6 overdriven by an amount of an order of about 100 microns. Upon such overdriving, it is possible that the position in the X-Y coordinate of a tip of a probe needle shifts by about 20 microns, at the maximum. In consideration of the above, in the present embodiment, after the height and the approximate X-Y coordinate position of the needle tips of the probe needles 6 are detected, the sequence goes to step 104 in FIG. 10 and high-precision X-Y position detection using the TV camera 20, shown in FIG. 5, is executed.

More specifically, at step 104, first the contact plate 21 is moved by the movement of the X-Y stage 3 and is positioned underneath (with respect to the Z direction) the right down needle tip (see FIG. 7) of one probe needle 6, in accordance with the data concerning the approximate position in the X-Y coordinate of that needle tip as measured at the above-described step 103. After this, in accordance with the positional data of the needle tip in the Z direction as measured at the above-described step 102, the contact plate 21 is moved upwardly by the pulse motor 62 and through the arm holder 60, so that by this contact plate 21 the needle tip of the probe needle 6 is overdriven in the same way as will be made at the time of the probe examination of an IC chip on a wafer. Then, in this state, the high-luminance LED 23 illuminates the needle tip of the probe needle 6 through the contact plate 21 and the thus illuminated needle tip is observed by the TV camera 20.

Since the objective lens 22 is an "infinite correction lens", regardless of upward/downward displacement of the objective lens 22, the position of the object surface as inputted into the TV camera 20 is constantly coincident with the upper surface of the contact plate 21. Therefore, in the present embodiment, a video image of a needle tip of an arbitrary height, as overdriven, can be inputted only by the upward/downward displacement of the objective lens 22 with the contact plate 21. Also, since the illumination system has an arrangement of a Kohler illumination system including, as a light source, a hetero-junction type high-luminance LED having uniform light distribution characteristics, it is small in size and tough to vibration and requires low electric power consumption with an additional advantage of small illuminance unevenness, as compared with an illumination system which includes, as a light source, a tungsten lamp or otherwise.

In the video image of the needle tip portion of the probe needle 6 as picked up by the TV camera 20, because of the fact that the needle tip portion usually has a metal surface having a high reflection factor and that the Kohler illumination is adopted, such surface portion other than the needle tip portion, which is not in a perpendicular positional relationship with the optical axis of the objective lens 22, appears dark. Additionally, those portion other than the needle tip portion is defocused. Therefore, only the needle tip portion appears bright. The video signal from the TV camera 20 is applied to the image processing unit 63 and, in this image processing unit, the inputted image is transformed into a binary-coded image. This is made by determining a suitable slice level for separating, out of a luminance histogram distribution of the picture elements of the TV camera 20, such a block as having a highest luminance. Subsequently, to the binary-coded image, a labeling process is executed to separate the needle tip portion and, then, measurements of the position of center of gravity, the major axis diameter and the minor axis diameter are effected. If, at this time, there is a very large difference between the major axis and minor axis diameters, it is possible that the level for binarization is too low. Accordingly, the binarizing process is executed again with an increased slice level and the measurements of the position of center of gravity, the measure axis diameter and the minor axis diameter are effected.

With the above-described procedure, the position of the right down needle tip in the X-Y coordinate is determined. After this, the controller 64 operates to move the contact plate 21 to a position underneath the left up needle tip (see FIG. 7) and, in a similar manner as in the case of the right down needle tip, the position of the left up needle tip in the X-Y coordinate is determined. Further, in a similar sequence, measurement is made to the position of the center of each of a number of needle tips which are disposed between the tips of the upper probe needles 6 shown in FIG. 7 or between the tips of the lower probe needles 6 shown in FIG. 7.

During the measurement of needle tip position, in the wafer prober of the present embodiment, a wafer is extracted out of an unshown wafer cassette and the prealignment operation for the extracted wafer is completed at an unshown prealignment stage. Therefore, just after completion of the measurement of the needle tip position at step 104, the sequence immediately goes to step 105 and the wafer conveyed from the prealignment stage is loaded on the wafer chuck 1. On the wafer, a number of IC chips are formed along scribe lines. Such a wafer is moved by the X-Y stage 3 and is placed underneath (with respect to the Z direction) the capacitance type sensor 4 shown in FIG. 1. At step 106, plural points on the outer peripheral portion of the wafer are measured to thereby detect the orientation of a flat portion (orientation flat) of the wafer. Then, the wafer chuck 1 is rotationally displaced by the pulse motor 50 shown in FIG. 4 so that the orientation flat of the wafer is aligned with a specified direction. Also, the center of the wafer is determined by calculation. Thereafter, at plural points on the wafer, the height is measured in a similar manner. This is made to allow that, at the probe examination, the amount of overdriving is controlled always at a constant value throughout the whole wafer surface, without being affected by the irregularity in height of the wafer surface. Subsequently, the sequence goes to step 107 in FIG. 10 and the surface of the rightward end portion of the wafer (one end portion with respect to the X-axis direction) is displaced and positioned underneath a microscope 502 by the X-Y stage 3. Also, the Z-axis stage 43 is moved upwardly/downwardly by the pulse motor 45 so as to set the wafer surface at the focus position of the microscope 502. In this state, the TV camera 502 operates to pick up an image of a pattern on the wafer surface through a microscope 501, and a corresponding video signal is supplied to the image processing unit 63. In response to the instructions from the prober sequence controller 64, the image processing unit 63 operates to execute the extraction of a vertically or horizontally elongated region of a constant density, within the inputted image, as well as the measurement of the width of that region. By this, a scribe line on the wafer is extracted. If the inputted image does not contain a pattern corresponding to a scribe line, the prober sequence controller 64 operates to displace the X-Y stage 3 in the X-axis or Y-axis direction by a predetermined distance, so that an image of a portion of the wafer surface which is in the neighborhood of the currently inputted area on the wafer is taken by the TV camera 502. Then, a similar procedure as described is repeated to execute the extraction of a scribe line.

Subsequently, the leftward end portion of the wafer surface (the other end portion in the X-axis direction) is placed underneath the microscope 502 and a similar processing as in the case of the rightward end portion is conducted to extract a scribe line on the wafer. On the basis of the result of extraction, the controller 64 operates to actuate the pulse motor 50 to rotate the wafer chuck 1 so as to bring vertically and horizontally extending scribe lines on the wafer into a parallel relationship with the guides 304 and 305 (along X axis) on the X-axis stage and the guides 306 and 307 (along the Y axis) on the Y-axis stage, respectively. By this, the $\theta$-error correction drive at step 107 is accomplished. When, with these operations, the controller 64 detects the position of predetermined one IC chip on the wafer, the sequence goes to step 108 and the controller 64 operates in accordance with the data representing the positions of the needle tips of the probe needles 6 as having been measured at step 104, to move the X-Y stage 3 to sequentially bring the points or positions within that IC chip, corresponding respectively to the positions of the needle tips of the probe needles 6 (more specifically, the predicted positions within that IC chip at which the presence of bonding pads is predicted), to the location underneath the microscope 501. Each wafer pattern image is supplied from the TV camera 502 to the image processing unit 63. In response to reception of the data concerning the size of each bonding pad or otherwise, from the controller 64, the image processing unit 63 detects and supplies a data concerning the position of the center of such a pattern in each wafer pattern image that corresponds to the bonding pad, back to the controller 64. Then, sequence goes to step 109 and, in the manner described hereinbefore, the controller 64 executes the extraction of real bonding pads on the basis of the data concerning the relative position of the centers of the bonding pads as having been collected at step 108 and the data concerning the relative position of the centers of the needle tips as having been measured at step 104, and also executes the calculation of an angular error in the $\theta$ direction of the needle tip group of the probe needles 6 corresponding to the bonding pad group.

The occurrence of this angular error is because of the presence of an angular error of each probe tip with respect to the outer configuration of a probe card, caused during the manufacture of the probe card, and an angular error which might be caused at the time of setting the probe card. This angular error is corrected by rotationally moving in the $\theta$ direction a card holder 701 fixedly supporting the probe card 7, as shown in FIG. 6, by means of a pulse motor 702. By the described operations, the angular adjustment of the probe card 7 relative to the bonding pads on the wafer, being held on the wafer chuck 1 with no angular error, is completed. Also, the relative position has been accurately determined between the bonding pads and the tips of the probe needles 6 of the probe card 7, in that state. Thus, it is now possible to move at step 110 a first IC chip on the wafer, to be tested first, exactly to the position under the probe card 7. At the subsequent step 111, the X-Y stage 3 is moved and indexed by a unit amount corresponding to the size of each IC chip on the wafer, on the basis of the outputs of the X-axis position detector 308 and the Y-axis position detector 309. For each unit movement, the examination of an IC chip is executed.

If, in the present embodiment, a residual error between a bonding pad and a corresponding needle tip, which error remains after the removal of the angular error between the bonding pad group and the needle tip group and after the subsequent optimum alignment of them in the X and Y directions, is larger than a tolerance which is preset with regard to one or more bonding pads and needle tips, an alarm is buzzed by an alarm 70 shown in FIG. 5 so that an operator is informed of the disorder of a probe card used. Since usually, in a probe card, the contact operations more than several hundreds thousand times will gradually cause minute shift of the needle tip position, the alarming is done to avoid use of such a disordered probe card for the examination. Also, while in the present embodiment the angular error is corrected by rotating the probe card 7 in the $\theta$ direction, this may be corrected by rotating in the $\theta$ direction the wafer chuck 1 which supports the wafer. In such case, it is necessary that, upon the indexing of the X-Y stage 3 by use of the X-axis position detector 308 and the Y-axis position detector 309 for the execution of the probe examination, the moving direction of the wafer chuck 1 placed on the X-Y stage 3 is inclined by an amount corresponding to the corrected angular error with respect to the X and Y axes of the X-Y coordinate.

In the foregoing embodiment, in order to calculate the angular error of the probe card 7 at step 109, it is necessary at step 108 to extract a number of bonding pads of an IC chip by use of the TV camera 502. This results in the possibility of slight reduction in the throughput. In consideration of this, it may be effective in some case that, by an operator, the information concerning the idealistic position of the tips of probe needles is preparatorily inputted into the apparatus from the operation panel. Details of such an example will be explained, taken in conjunction with the flow chart of FIG. 11. The structure of the major assembly of the apparatus is the same as that of the FIG. 1 embodiment.

Figure 11:
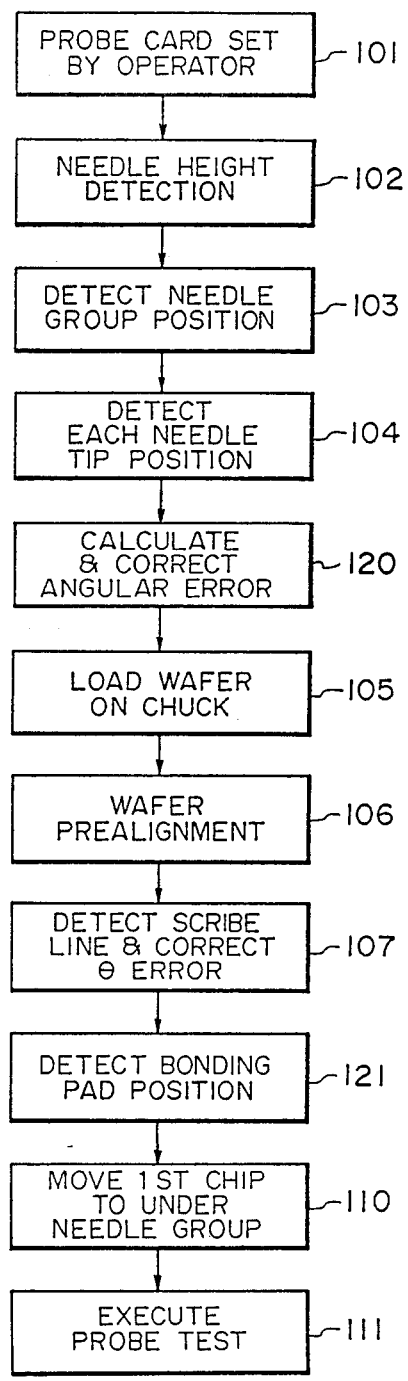
FIG. 11 is a flow chart showing the operations made in another embodiment of the present invention, wherein the site of probe needle tips are set preparatorily.

The feature of the embodiment shown in the flow chart of FIG. 11, over the above-described embodiment, lies in the point that, since the idealistic position of the tips of probe needles 6 mounted by the card holder 701 is preparatorily set in the prober sequence controller 64, the angular error of a probe card 7 can be corrected at step 120 without observation of the bonding pads of an IC chip on the wafer by use of the TV camera 501. Another point is that, since no factor of angular error of the probe card 7 is included, the measurement of the bonding pad positions at step 121 can be executed correctly with the observation, by the TV camera 502, of a reduced number of points within the IC chip.

The operation to be made in this embodiment will be explained in more detail. Steps 101–104 are substantially the same as those in the foregoing embodiment. After completion of step 104, the sequence goes to step 120 whereat calculation is made on the basis of the data representing the idealistic position of each needle tip group of the probe needles 6 having been set in the prober sequence controller 64 (FIG. 5) and the data representing the actual position of the needle tip group of the probe needles 6 of the probe card 7, held by the card holder 701, as having been measured at step 104 by use of the TV camera 20, to determine the angular error in the $\theta$ direction therebetween. By an amount corresponding to the calculated angular error, the card holder 701 is rotated by the pulse motor 702 (FIG. 6) to thereby set the needle tip group of the probe needles 6 at the idealistic position as set in the prober sequence controller 64. Subsequently, in the same manner as in the foregoing embodiment, a wafer is loaded on the wafer chuck 1 (step 105) and the wafer is prealigned by use of the capacitance type sensor 4 (step 106). Then, at step 107, the TV camera 502 is used to detect a scribe line on the wafer and correction is made to the $\theta$-error of the wafer on the wafer chuck 1. Then, the sequence goes to step 121. In the present embodiment, at step 120, the needle tip group of the probe needles 6 is set at the idealistic position (the state having no $\theta$-error, namely, the state in which the direction of array of the needle tip group is substantially coincident with the direction of array of the bonding pads in an IC chip of a wafer on the wafer chuck 1, having been $\theta$-corrected at step 107). Therefore, it is not necessary to effect the $\theta$-error correction of the probe card 7, to be made at step 109 in FIG. 10, for aligning the needle tips with the bonding pads. As a result, for the image-taking of bonding pads in an IC chip by the TV camera 502, the image-taking of only predetermined ones of a number of bonding pads in the IC chip corresponding to the number of the probe needle groups, is sufficient. On the basis of the positions of these bonding pads in the X-Y coordinate, determined therefrom, the X-Y stage 3 is controllably moved at step 110 so that a first chip on the wafer is placed underneath the probe needle group. Thereafter, the sequence goes to step 111 whereat the controller 64 starts the probe examination.

Figure 8:
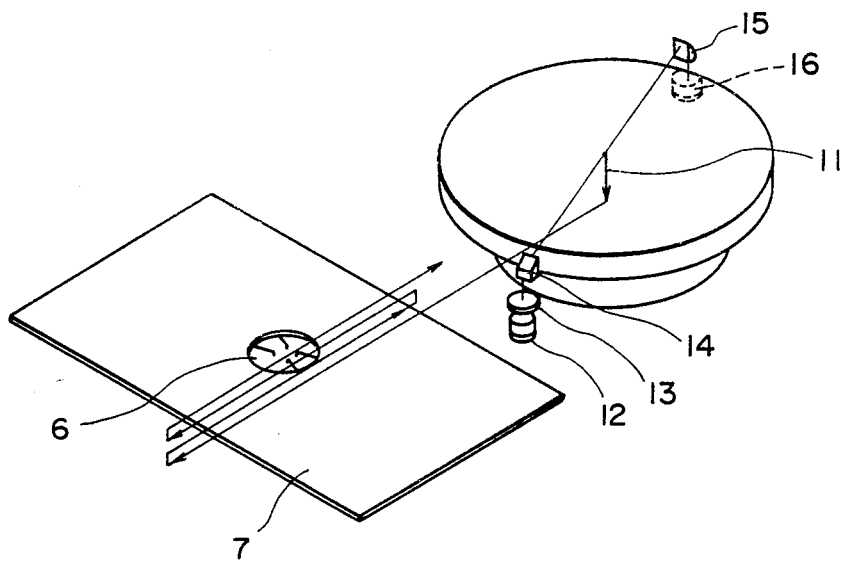
FIG. 8 is a schematic view explicating the manner of approximate position measurement, in the Z direction, of probe needle tips by use of a laser beam, the measurement being made in accordance with another embodiment of the present invention.

Also, while in the foregoing embodiment the touch plate 10 is used for the detection of the height (Z-axis position) of the probe needles 6, this may be made by use of the laser beam 11. More specifically, the height of the needle tip group of the probe needles 6 can be detected by using the laser beam 11 in the following manner: That is, as shown in FIG. 8, while changing the height of the laser beam 11 by moving the Z-axis stage 43 shown in FIG. 4 in the Z direction, the underneath of the probe needles 6 is scanned by the X-Y stage 3 and the height at which the laser beam 11 is turned into a blocked state, with respect to the light receiving element 16, by a tip of a prove needle 6, is detected on the basis of the number of pulses as applied to the pulse motor 45 shown in FIG. 4. However, as described hereinbefore, the accuracy of the position measurement using the laser beam 11 is not sufficient. For this reason, in the case of this embodiment, it is preferable that, at step 131 in the flow chart of FIG. 12, when a video image of a tip of a probe needle 6 is inputted by the TV camera 20, the contact plate 21 shown in FIG. 5 is moved upwardly/downwardly in the Z direction so that a minimum the video image of this needle tip can be formed whereby, from the height of the contact plate 21 as obtainable on the basis of the number of pulses applied to the pulse motor 62 at that time, the position measurement for the needle tip height can be executed more correctly.

The operation of this embodiment is such as shown in the flow chart of FIG. 12. Namely, when at step 101 a probe card 7 is set by an operator, the approximate position in the X-Y coordinate of the tips of the probe needles 6 is detected in the manner described with reference to FIG. 7 (step 130). Also, the approximate position (height) in the Z-direction of the tips of probe needles 6 is detected in the manner described with reference to FIG. 8. Thereafter, at step 131, the TV camera 20 (FIG. 5) is used to take an image of a tip of a probe needle 6 contacting the contact plate 21. At this time, as described, the contact plate 21 is moved upwardly/downwardly so that the size of the image of the needle tip becomes the minimum, such that also the position of the needle tip in the Z direction is measured. After this, at step 105, similar operations as in the foregoing embodiment are executed.

Figure 9:
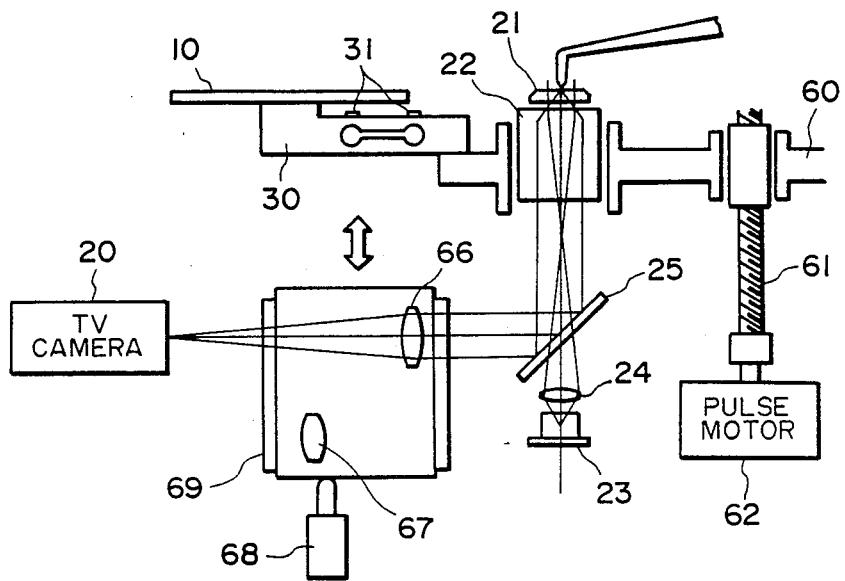
FIG. 9 is a schematic and diagrammatic view for explicating the manner of approximate position measurement, in an X-Y coordinate, of probe needle tips by using video signals, the measurement being made in accordance with another embodiment of the present invention.

Further, while in the foregoing embodiment the laser beam 11 is used for the measurement of the approximate position of the needle tip of a probe needle 6 in the X-Y coordinate, this measurement may be made by providing a variable magnification microscope, having interchangeable low and high magnifications, for inputting a video image of a tip of a probe needle 6 into the TV camera 20. The structure of such a microscope for inputting a video image of a needle tip is exemplified in FIG. 9. In this Figure, denoted at 66 is a relay lens, for a high magnification, for imaging each needle tip upon the TV camera 20; at 67, a relay lens, for a low magnification, for imaging a supporting portion of the needle tip group upon the TV camera 20; at 68, a linear solenoid for interchanging the high-magnification relay lens 66 and the low-magnification relay lens 67; and at 68, a linear guide. The low-magnification relay lens 67 is used to input an image of the support for a horizontal portion of the needle tip group of the probe needles 6, while the high-magnification relay lens 66 is used for input an image of the tip portion of the needle tip group of the probe needle 6. Namely, with the high-magnification relay lens 66, a narrow region adjacent the tip of a probe needle 6 contacting the contact plate 21 is image-taken by the TV camera 20, such that a fine video signal for the needle tip is inputted into the image processing circuit 63 (FIG. 5). With the low-magnification relay lens 67, on the other hand, the TV camera 20 takes an image of a relatively wide region including the tip of a probe needle 6 and, from the corresponding video signal, the image processing circuit 63 detects the position of the needle tip in the obtained picture plane, from which the approximate position of the needle tip in the X-Y coordinate is detected.

As described in the foregoing, according to the embodiments in this aspect of the present invention, the alignment operation for probe needle tips which has been made manually by an operator can be made automatically. Also, the alignment is attainable in the "overdriven" state and without contamination of probe needle tips. Further, the alignment can be made very quickly, as compared with manual alignment. Also, according to the described embodiments of the present invention, no consumable part is required and the alignment is attainable without affecting the IC tester side. Therefore, the maintenance is very easy.

Figure 13:
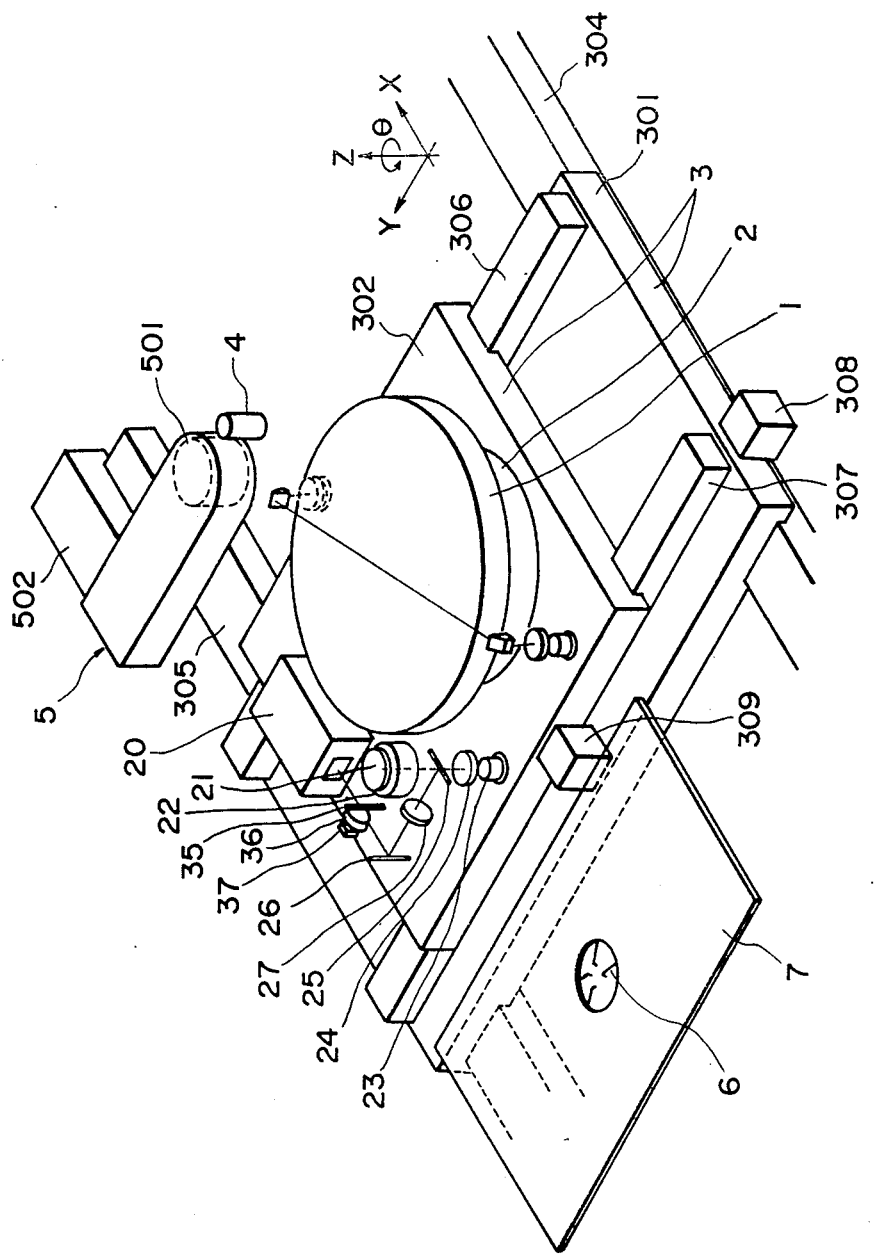
FIG. 13 is a perspective view of a wafer prober according to a further embodiment of the present invention.

Referring now to FIG. 13 which schematically shows an upper portion of a wafer prober according to another embodiment of the present invention, denoted at 1 is a wafer chuck for carrying thereon a wafer; at 2, a $\theta$-Z stage adapted to move the wafer chuck 1 in the $\theta$ and Z directions; and at 3, an X-Y stage which is adapted to move the $\theta$-Z stage 2 in the X and Y directions and which comprises an X-axis stage 301 and a Y-axis stage 302. The X-axis stage 301 is movable while being guided by guides 304 and 305 which are fixedly supported by a base member, not shown. The Y-axis stage 302 is movable while being guided by guides 306 and 307 which are fixedly supported by the X-axis stage 301. Denoted at 308 is a position detector for detecting the position of the X-axis stage 301 in the X direction, by use of a scale (not shown). Denoted at 309 is another position detector for detecting the position of the Y-axis stage 302 in the Y direction, by use of a scale (not shown).

Denoted at 4 is a capacitance type sensor for measuring the outer configuration of a wafer as well as the position (height) of the wafer in the Z direction; and at 5, an image pickup device for image-taking the pattern of an IC chip on the wafer, the image pickup device including a microscope 501 and a TV camera 502.

Denoted generally by a reference numeral 6 are probe needles which are operable to provide electric contact with bonding pads of each IC chip (in FIG. 1, only four outermost ones of a number of probe needles being illustrated). Denoted at 7 is a probe card (printed board) on which the probe needles 6 are arrayed and fixedly mounted to assure that the tips of the probe needles 6 correspond, in a one-to-one relationship, to the bonding pads (in a group) which are arrayed on each IC chip in a predetermined state.

Denoted at 20 is a TV camera for image-taking, through an objective lens 22, a tip of a probe needle 6 being press contacted to a contact plate 21, for measurement of the position of the tip of the probe needle 6. The TV camera 20 is provided on the Y-axis stage 302. In this embodiment, the objective lens 22 is provided by what is called an "infinite correction lens" by which a light flux from an object point at a focus position can be emitted in the form of a parallel light. Denoted at 23 is a light source for illuminating the tip of the probe needle 6. For example, the light source 23 may comprise a heterojunction type high-luminance light emitting diode (LED). The light source 23, the condensing lens 24 and a half mirror 25 cooperate to provide an illumination system. The contact plate 21 has an outer peripheral portion 21a which is tapered so as to prevent that, when the tip of a probe needle 6 is pressed against thereto, the needle tip shifts outwardly to the side face of the contact plate 21.

Denoted at 27 is a relay lens for imaging, upon an image pickup surface of the TV camera 20 through a mirror 26, the light reflected by the tip of a probe needle 6 contacting the contact plate 21 and emanating from the objective lens 22 in the form of a parallel light. Each of the TV cameras 20 and 502 may be provided by a two-dimensional CCD or otherwise.

Figure 14:
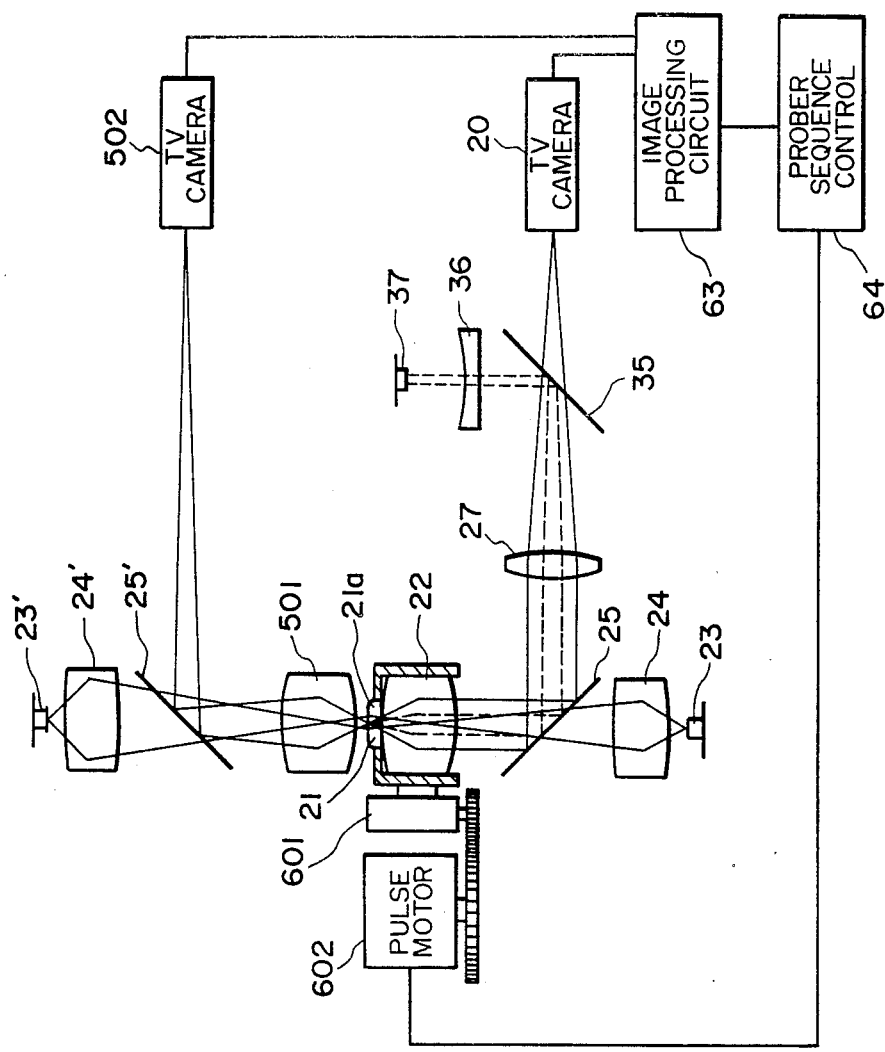
FIG. 14 is a schematic and diagrammatic view showing a probe needle detecting image pickup system and a bonding pad detecting image pickup system of the FIG. 13 embodiment.

FIG. 14 shows in detail the optical arrangement of the detection optical systems of the TV cameras 20 and 502. Denoted in FIG. 14 at 37 is a semiconductor laser. The laser beam from the semiconductor laser 37 is directed by a condensing lens 36 and a half mirror 37 and is projected upon the objective lens 22, such that it is focused in the neighborhood of the upper surface of the contact plate 21, as seen in FIG. 14. Denoted at 23' is a light source for illuminating the wafer through a condensing lens 24', a half mirror 25' and an objective lens 501 when an IC chip (bonding pads) on the wafer held by the wafer chuck 71 is to be observed by the TV camera 502. Similarly to the light source 23, the light source 23' may be provided by a hetero-junction type high-luminance LED, for example. Image processing circuit 63 is adapted to process the video signals from the TV camera 20 and 502 and to detect the positions of a bonding pad and a probe needle tip in the picture planes of the TV cameras 20 and 502. Prober sequence controller 64 is operable to control the sequence of the wafer prober as a whole and also to control the drive of a pulse motor 602. Denoted at 601 is a ball screw coupled to a pulse motor 602 by way of a gear. The rotation of the ball screw 601 moves the contact plate 21 and the objective lens 22 as a unit in the Z direction (upwardly/downwardly).

Figure 21:
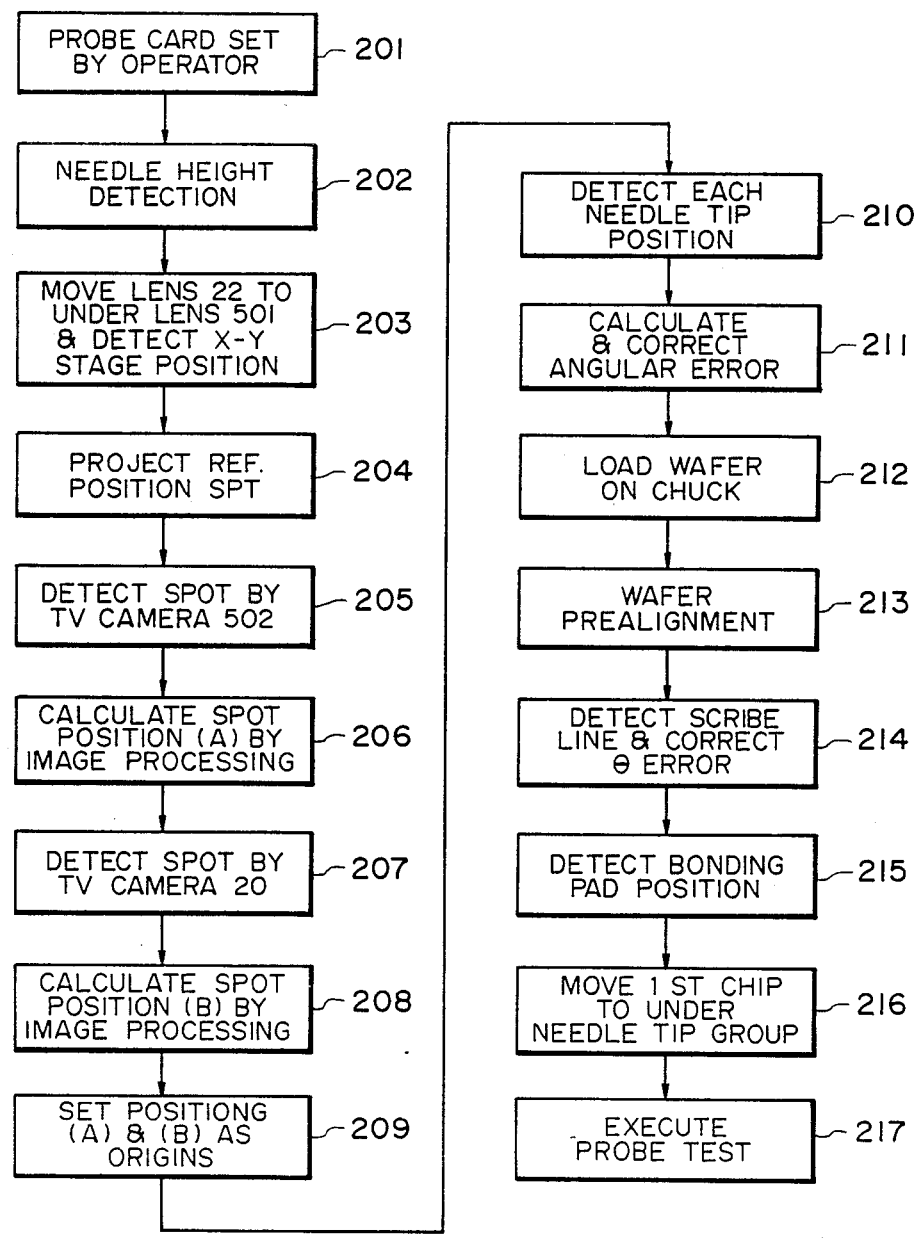
FIG. 21 is a flow chart showing the operational sequence in the embodiment of FIG. 13.

The operation of the prober sequence controller 64 of the present embodiment will be explained in detail, taken in conjunction with the flow chart of FIG. 21. At step 201 in FIG. 21, the operator sets a probe card 7 in the wafer prober such as shown in FIG. 13 and, then, as the sequence starts, first the prober sequence controller 64 operates to control an unshown Z-axis detector to detect the height (Z-axis position) of the needle tip group of the probe needles 6 (step 202), and also to control the rotation of the ball screw 601 through the pulse motor 602 so that the upper surface of the contact plate 21 is positioned at the detected height. Thereafter, at step 203, the controller controls the movement of the X-Y stage 3 so that, as shown in FIG. 14, the objective lens 20 is positioned below the objective lens 502. Also, the position $S_0 (X_{S0}, Y_{S0})$ of the X-Y stage 3 at this time is measured by use of detectors 308 and 309 shown in FIG. 13, the measured position being memorized in a memory within the controller 64. Then, in order to allow discrimination, at high precision (of an order not greater than about 3 microns), of the relative relationship between the position measured on the basis of the video signal from the TV camera 20 and the position measured on the basis of the video signal from the TV camera 502, the semiconductor laser 37 is energized at step 204 and the laser beam therefrom is focused into a spot upon the upper surface of the contact plate 21. At this time, the upper surface of the contact plate 21 has been set, by the above-described Z-axis displacement of the contact plate 21 by means of the pulse motor 602, at such position which is optically conjugate with the image pickup picture plane of the TV camera 502 with respect to the objective lens 501. Therefore, the laser beam having transmitted the upper surface of the contact plate 21 and being directed to the TV camera 502 by way of the objective lens 501 and the half mirror 25', is focused upon the image pickup picture plane 502' of the TV camera 502, such as shown in FIG. 15A, similarly to the spot formed on the upper surface of the contact plate 21. The position denoted at A of the light spot formed on the picture plane 502' corresponds to the position of the light spot on the upper surface of the contact plate 21. On the other hand, the laser beam having been reflected by the upper surface of the contact plate 21 and being directed to the TV camera 20 by way of the objective lens 22, the half mirror 25, the relay lens 27 and the half mirror 35 is focused upon the picture plane 20' of the TV camera 20, such as shown in FIG. 15B, similarly to the spot on the upper surface of the contact plate 21, since the upper surface of the contact plate 21 and the picture plane of the TV camera 20 is held in an optically conjugate relationship by means of the infinite-correction type objective lens 22 and the relay lens 27. The position B of the light spot on the picture plane 20' corresponds to the position of the light spot on the upper surface of the contact plate 21. In FIGS. 15A and 15B, reference character E denotes the center of the picture plane 502' and reference character F denotes the center of the picture plane 20'.

At step 205, the TV camera 502 is used to pick up the spot image as projected upon the picture plane 502'. The video signal obtained at this time is subjected to binary-coding and the like in the image processing circuit 63, such as shown at step 206, whereby the spot position A is measured and memorized into a memory within the controller 64. Also, at step 207, the TV camera 20 is used to pickup the spot image as projected on the picture plane 20' and, by processing the video signal, obtained at this time, in the image processing circuit 63 such as shown at step 208, the spot position B is measured and memorized into the memory within the controller 64. After this, the prober sequence controller 64 operates to set the spot positions A and B upon the respective picture planes, as having been memorized at step 209, as respective positional references (origins 0) for the first image pickup system having the objective lens 501 and the TV camera 502 and for the second image pickup system having the objective lens 22 and the TV camera 20, respectively. Namely, coordination of origins is made for the position measurement by these image pickup systems.

After the origins of these two image pickup systems are brought into agreement with each other, in the described manner, the sequence goes to step 210 and steps following thereto, and the wafer prober starts the alignment operation for the tips of the probe needles 6 of the probe card 7 and the bonding pads of an IC chip on the wafer, held by the wafer chuck 1, by using the two image pickup systems. It is not necessary that the operations up to step 209 are made each time a wafer is loaded on the wafer chuck 1. For example, these operations may be made each time the probe card is replaced by another. Alternatively, they may be made at once at the time of start of the wafer prober. Of course, these operations may be made each time a wafer is loaded on the wafer chuck 1.

At step 210, first the X-Y stage 3 is moved to place the contact plate 21 at the position of the tip of a probe needle 6, and the position $S_1 (X_{S1}, Y_{S1})$ of the X-Y stage 3 at this time is measured by the detectors 308 and 309 and is memorized into the memory within the controller 64. Subsequently, the contact plate 21 and the objective lens 22 are moved as a unit in the Z direction by the pulse motor 62 so as to bring the upper surface of the contact plate 21 into contact with the tip of a probe needle 6, as shown in FIG. 16. In this state, the light from the light source 23 is directed to the objective lens 22 by way of the condensing lens 24 and the half mirror 25 to thereby illuminate the tip of the probe needle 6. The lower end portion of the tip of a probe needle 6, particularly its contact portion to be electrically contacted to a bonding pad, usually has a curved or flat surface having a high reflection factor and, therefore, the luminance is high. Also, since the objective lens 22 is of "infinite correction type", the imaging relationship between the image pickup plane 20' of the TV camera 20 and the upper surface of the contact plate 21 can be maintained irrespective of the Z-axis displacement of the objective lens 22 through the pulse motor 602 and the ball screw 601. As a result, it is possible to measure, by the image processing in the image processing circuit 63, the position D $(X_D, Y_D)$ of the needle tip image (FIG. 15B) as projected upon the image pickup plane 20' of the TV camera 20. At step 210, on the basis of the thus measured position D of the needle tip image upon the image pickup plane 20' and of the origin 0 of the image pickup plane 20' described hereinbefore, the position H $(X_H, Y_H)$ of the needle tip of the probe needle 6 is detected by using the following equation (1), that is:

$$H = (S_1 - S_0) + (D - O) \quad \ldots (1)$$

In this equation, $S_1$ and $S_0$ are such as described hereinbefore. It should be noted here that the needle tip position H as above is detected with regard to each of the probe needles provided on the probe card 7 or, alternatively, with regard to each of the four probe needles 6 shown in FIG. 13. Thereafter, at step 211, any angular error of the probe card 7 is detected from the relative relationship between the position of each needle tip as detected at step 211 and the idealistic position of each needle tip to be set, and the thus detected angular error is corrected by rotating the probe card 7 in the θ direction by use of an unshown θ-error correcting mechanism.

Subsequently, at step 212, a wafer is loaded on the wafer chuck 1 and, at step 213, the capacitance type sensor is used to prealign the wafer in a well-known manner. Thereafter, the X-Y stage 3 is moved to place the wafer underneath the objective lens 501. The position of the X-Y stage 3 at this time is measured by the detectors 308 and 309, as the position $S_2 (X_{S2}, Y_{S2})$, and the measured position is memorized into the memory within the controller 64. In this state, the light source 23' (FIG. 14) is lightened and the light therefrom is directed by way of the condensing lens 23, the half mirror 24 and the objective lens 501 to illuminate the wafer placed on the wafer chuck 1. The TV camera 502 picks up an image of a scribe line on the wafer (step 214). By processing the video signal from the TV camera 502 at this time, the image processing circuit 63 detects the inclination of the scribe line, that is, the angular error of the wafer held by the wafer chuck 1. For correction of this angular error, the prober sequence controller 64 rotates the wafer chuck 1 in the θ direction through the θ-Z stage 2. After this, at step 214, the TV camera 502 picks and forms, on its image pickup plane 502', an image of a bonding pad on the wafer, such as shown in FIG. 15A. On the basis of the video signal obtained at this time from the TV camera 502, the image processing circuit 63 detects the position C $(X_C, Y_C)$ of the image of the bonding pad in the image pickup plane 502'. On the basis of the thus detected position C and of the origin of the image pickup plane 502' determined preparatorily, the prober sequence controller 64 detects the position I $(XI, YI)$ of the bonding pad by using the following equation (2), that is:

$$I = (S_2 - S_0) + (C - O) \ldots (2)$$

In this equation, $S_2$ and $S_0$ are such as described hereinbefore. Similarly, the bonding pad position such as described is detected with regard to each of all the bonding pads existing within one IC chip or, alternatively, with regard to some of these bonding pads.

Subsequently, on the basis of the position H of the probe needle 6 detected at step 210 and of the position I of the bonding pad detected at step 215, the prober sequence controller 64 calculates the relative positional relationship between them with respect to the X and Y directions. Also, at step 216, the controller 64 moves the X-Y stage 3 so as to move first one of plural IC chips on the wafer, to be examined first, to the location under the probe needles 6 and, thereafter, align the bonding pads of that IC chip with the probe needle group of the probe card 7. Then, by using the θ-Z stage 2, the wafer chuck 1 is moved (upwardly) in the Z direction so that the bonding pads contact the probe needles. Then, the probe examination at step 217 is executed. The probe examination for the remaining IC chips is executed in accordance with a well-known sequence, based on the stepwise movement of the X-Y stage 3.

Figure 17:
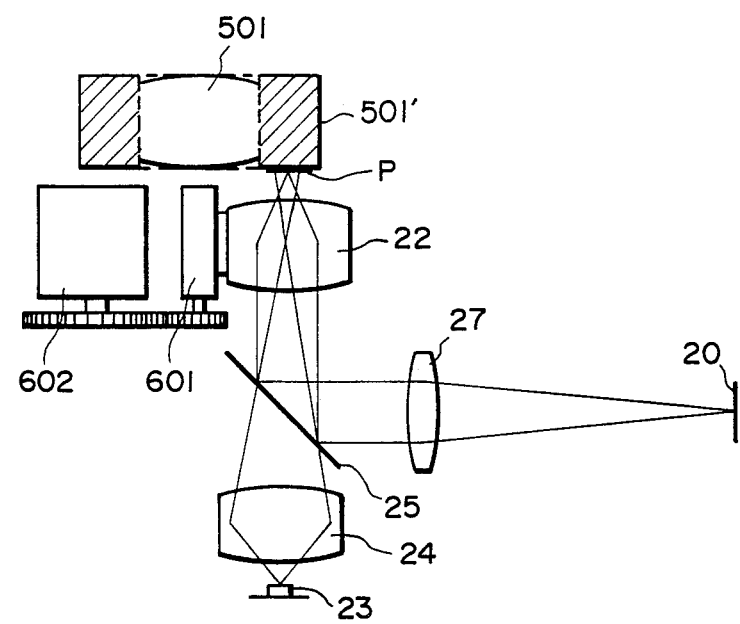
FIG. 17 is a schematic view showing a still further embodiment of the present invention.
Figures 18A, 18B:
FIGS. 18A and 18B are enlarged schematic views, respectively, showing examples of patterns usable in the FIG. 17 embodiment.

FIG. 17 shows another embodiment. Denoted at 501' is a barrel for an objective lens 501, having a pattern P, such as shown in FIG. 18A, formed on its bottom surface. The remaining portion of the present embodiment is the same as the corresponding portion of the foregoing embodiment. In this embodiment, the pattern P is used as a reference for the detection of the relative position of the two image pickup systems. More particularly, the distance between the pattern P and the detecting position using the objective lens 501 is preparatorily measured and, by detecting the pattern P by using the TV camera 20 through the objective lens 22, the relative position of the two image pickup systems is measured. The pattern P is not limited to the FIG. 18A example. Any pattern that can be processed by the image processing circuit 63 (FIG. 14) is usable. For example, a pattern P' such as shown in FIG. 18B may be used. While, in this embodiment, the pattern P is provided on the barrel 501' of the objective lens 501, it may be provided on a barrel of the objective lens 22.

Figure 19:
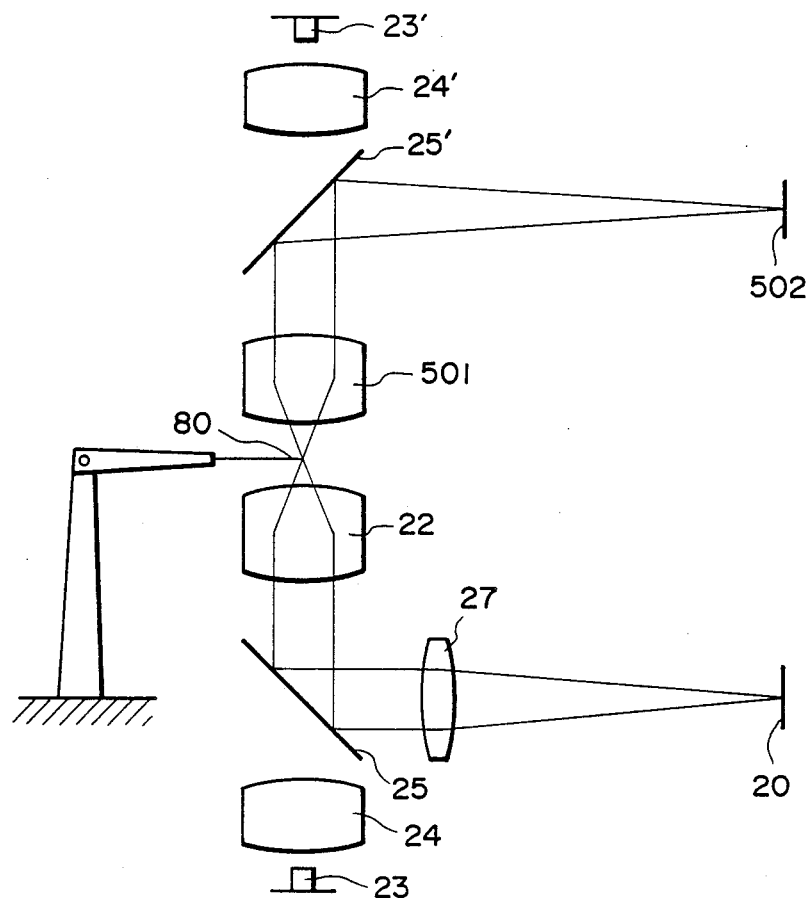
FIGS. 19 and 20 are schematic views, respectively, showing yet further embodiments of the present invention.

FIG. 19 shows a further embodiment of the present invention. Denoted at 80 is a probe which extends from a suitable position on the major assembly of the wafer prober to the focus position of an objective lens 501. The remaining portion of this embodiment is similar to the corresponding portion of the foregoing embodiments. In this embodiment, the relative position of the two image pickup systems is detected by image-taking the probe 80 by use of the TV cameras 20 and 502.

Figure 20:
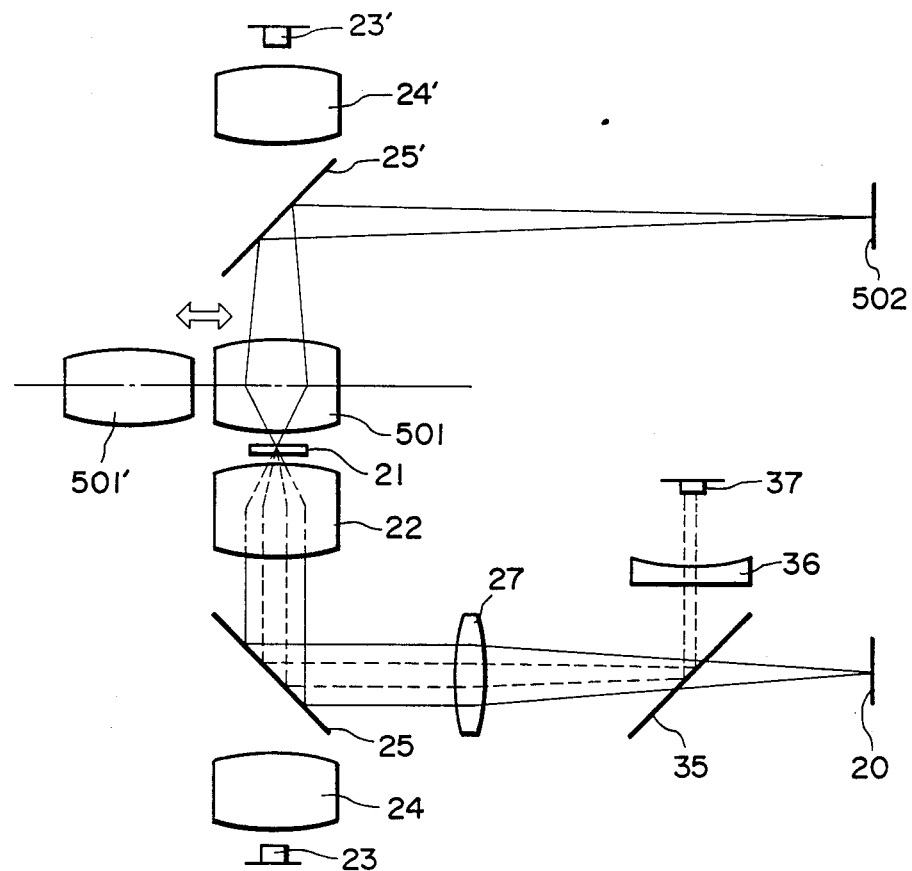

FIG. 20 shows a yet further embodiment. In this embodiment, the present invention as illustrated in FIG. 14 is applied to a wafer prober wherein the magnification for observing a wafer from the above is changeable. FIG. 20 schematically shows an example wherein two objective lenses 501 and 501' having different magnifications are moved horizontally to change the magnification. While a particular mechanism for moving the objective lenses 501 and 501' is not illustrated in FIG. 20, usually it is not easy to displace the objective lens 501' of high magnification to a predetermined position with good reproducibility. However, as has been described with reference to the foregoing embodiments, use of a spot of a laser beam from a laser source 37 as a reference mark upon each of the image pickup planes 20' and 502', is effective because, by doing so, any error due to the interchanging of the objective lenses 501 and 501' can be absorbed. Therefore, only a simple interchanging mechanism is required and, as a result of which, the cost can be reduced. This is also the case with the embodiment shown in FIGS. 17 and 18.

Figure 22:
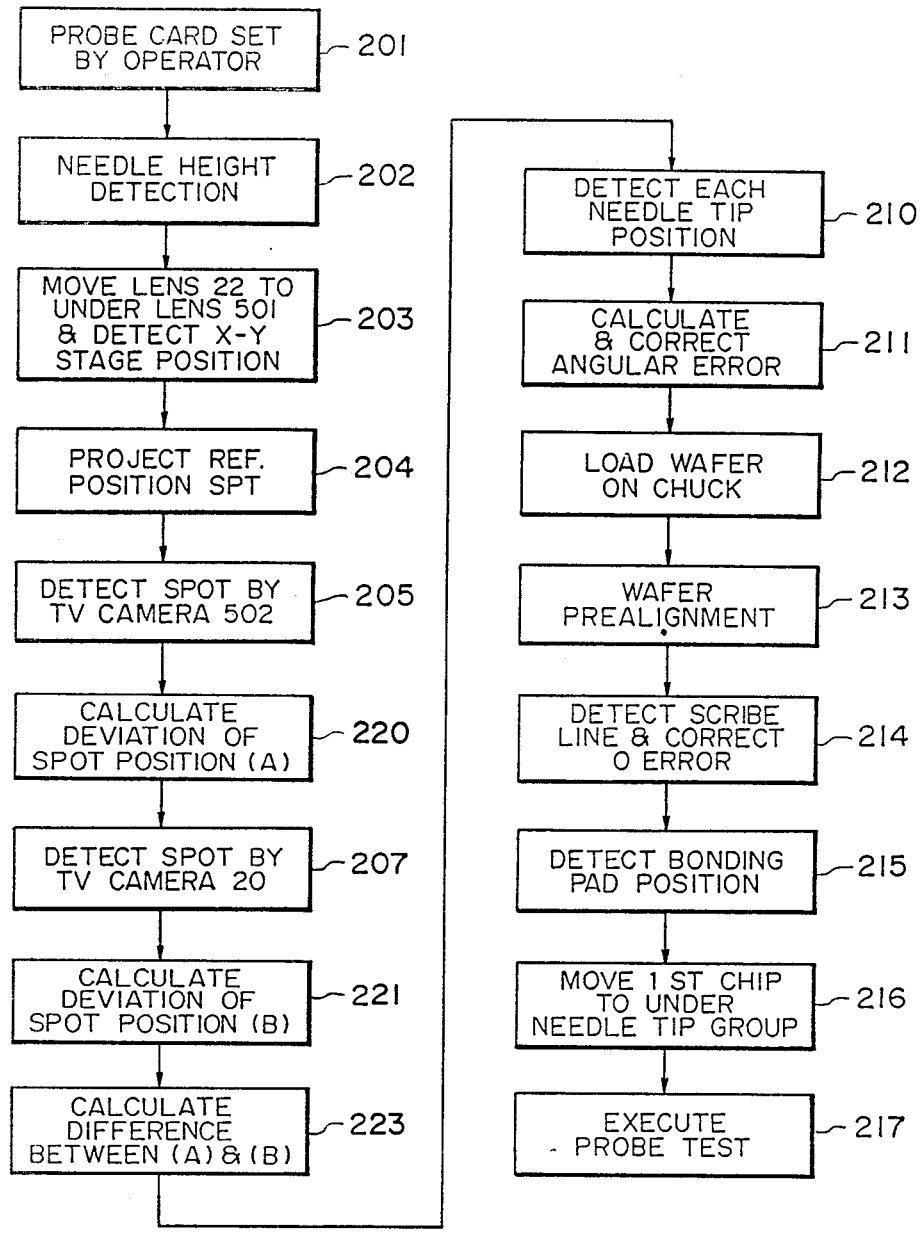
FIGS. 22 and 23 are flow charts, respectively, showing operational sequences made in accordance with still further embodiments of the present invention.

FIG. 22 shows a still another embodiment. In the embodiment of FIG. 14, the sequence shown in the flow chart of FIG. 21 is such that the positional origins of the two image pickup systems is set at the positions of light spots on the image pickup planes 20' and 502' as the X-Y stage 3 assumes a predetermined position. As compared therewith, in the present embodiment, the origins are set at the centers E and F of the image pickup planes 20' and 502' and, by calculating the error between the positions A and B of the spots on the picture planes, the relative positional relationship between the detecting positions of the two image pickup systems is corrected. In this embodiment, in place of step 206 in FIG. 21, step 220 is provided to detect, by the image processing, the deviation between the position A and the center E ($X_E$, $Y_E$). Also, in place of step 208 in FIG. 21, step 221 is provided to detect, by image processing, the deviation between the position B and the center F ($X_F$, $Y_F$). From those detected deviations, the positional error between the positions A and B is detected (step 223). Then, by an amount corresponding to the detected positional error, the positional relationship of the bonding pad and the probe needle, as obtained with respect to the centers E and F, respectively, is corrected. The remaining portion of this embodiment is similar to corresponding portion of the foregoing embodiment.

Figure 23:
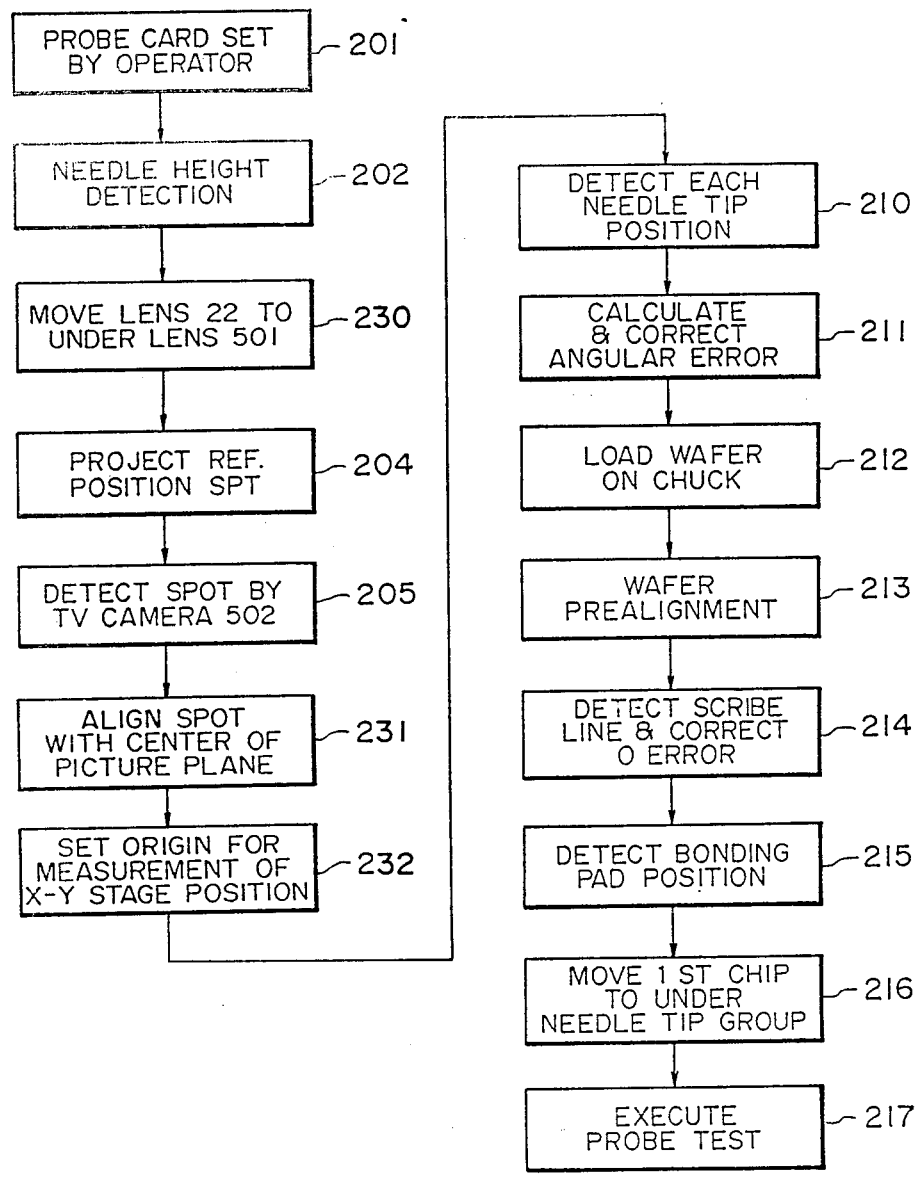

FIG. 23 shows a yet further embodiment. In the FIG. 14 embodiment, while the sequence shown in the flow chart of FIG. 21 is such that the error between the image pickup planes 20' and 502' is electrically corrected, in the present embodiment it is corrected mechanically. More specifically, in the present embodiment, the optical axis of the objective lens 501 and the center E of the image pickup plane 502' is preparatorily aligned by adjustment. Also, the optical axis of the objective lens 22, the center F of the image pickup plane 20' and the position B of the center of the spot image are aligned preparatorily by adjustment. In such a state, at step 231, the X-Y stage 3 is driven so that the spot image by the laser beam 37 is projected upon the center E of the picture plane 502'. By doing so, the optical axes of the two image pickup systems and the centers E and F of the image pickup planes are brought into alignment, at once. Therefore, the position of the X-Y stage 3 at this time is set as an origin (step 232). The remaining portion of this embodiment is similar to corresponding portion of the foregoing embodiment.

As described hereinbefore, in accordance with the embodiments of this aspect of the present invention, the alignment operation for probe needle tips which has been made manually can be made automatically. Also, the alignment is attainable quickly and correctly, at a constant precision, as compared with the manual alignment. Further, according to these embodiments of the present invention, no consumable part is required and the alignment is attainable without affecting the IC tester side. Therefore, the maintenance is very easy.

Further, according to this aspect of the present invention, an image pickup system for detecting needles and an image pickup system for detecting bonding pads can be positionally adjusted at an arbitrary moment of time, with respect to one and the same reference. Therefore, only a reasonable rigidity is required for the structure for holding each image pickup system and, therefore, an expensive high-rigidity system is not necessary. As a result, the present invention can provide an inexpensive apparatus.

While the invention has been described with reference to the structures disclosed herein, it is not confined to the details set forth and this application is intended to cover such modifications or changes as may come within the purposes of the improvements or the scope of the following claims.

What is claimed is:

1. A wafer prober, comprising:
   a wafer chuck for holding a wafer;
   an X-Y stage for moving said wafer chuck in X and Y directions;
   a contact plate;
   a driving mechanism for moving said contact plate in a Z direction relatively to said X-Y stage;
   detecting means for detecting information which can be used to press contact said contact plate against at least one of tips of probe needles of a probe card with use of said X-Y stage and said driving mechanism;
   image pickup means for observing said at least one needle tip press contacted to said contact plate, from a side of said contact plate opposite to the side thereof engaged by said at least one needle tip; and
   processing means for processing a signal from said image pickup means to obtain information to be used for alignment of the probe needles with the wafer.

2. A wafer prober according to claim 1, wherein said detecting means includes a light source for projecting a light beam along a wafer holding surface of said wafer chuck and a photoelectric detector for photoelectrically detecting the light beam.

3. A wafer prober according to claim 2, wherein said detecting means detects the position of at least one of the tips of the probe needles with respect to the X and Y directions, on the basis of a photoelectric output of said photoelectric detector obtained when the light beam is scanned by said X-Y stage relatively to the probe needles.

4. A wafer prober according to claim 3, wherein said detecting means detects the position of at least one of the tips of the probe needles in the Z direction, on the basis of an output of said photoelectric detector obtained when the scan of the light beam by said X-Y stage is repeated while moving the light beam in the Z direction relative to the holding surface of said wafer chuck.

5. A wafer prober according to claim 3, wherein said detecting means includes a touch plate, a deformable member for supporting said touch plate and a semiconductor strain gauge fixed to said deformable member and wherein said detecting means detects the position of at least one of the tips of the probe needles in the Z direction, on the basis of an output of said semiconductor strain gauge as obtained when said touch plate is pressed in the Z direction against said at least one needle tip.

6. A wafer prober according to claim 1, wherein means are provided for rotating the probe card in a $\theta$ direction to thereby correct an error in the $\theta$ direction between the wafer and the probe needles and wherein means are provided for moving said wafer chuck through said X-Y stage in at least one of the X and Y directions for sequential examination of plural chips on the wafer by use of the probe needles.

7. A wafer prober according to claim 1, wherein means are provided for rotating said wafer chuck in a $\theta$ direction to thereby correct an error in the $\theta$ direction between the wafer and the probe needles and wherein means are provided for moving said wafer chuck, through said X-Y stage, with an inclination of an angle corrected with respect to one of the X and Y directions, for sequential examination of plural chips on the wafer by use of the probe needles.

8. A wafer prober according to claim 1, wherein means are provided for detecting a relative positional relationship among the probe needles on the basis of an imagewise signal from said image pickup means and also to provide an alarm when the detected positional relationship is out of a predetermined tolerable state.

9. A wafer prober, comprising:
a wafer chuck for holding a wafer;
a stage for moving said wafer chuck so that grouped probe needles of a probe card are contacted in a sequence to bonding pads of chips of the wafer;
first image pickup means for observing at least one bonding pad and for producing a first imagewise signal;
second image pickup means for observing at least one of tips of the probe needles and for producing a second imagewise signal;
reference providing means for providing a reference for coordination of said first and second signals;
wherein said reference can be observed through at least one of said first and second image pickup means; and
signal processing means for detecting information for use in alignment of the probe needles with the bonding pads of each chip, on the basis of the first and second signals and the reference.

10. A wafer prober according to claim 9, wherein said reference providing means forms a light spot at a position between objective lenses of said first and second image pickup means.

11. A wafer prober according to claim 9, wherein said reference providing means includes a reference member which is in a predetermined positional relationship with an objective lens of one of said first and second image pickup means.

12. A wafer prober according to claim 11, wherein said reference member comprises a pattern provided on a barrel of said objective lens.

13. A wafer prober comprising:
a wafer chuck for holding a wafer for movement in X and Y directions;
a contact plate;
a driving mechanism for moving said contact plate in a Z direction relatively to said X-Y stage;
image pickup means having higher and lower magnifications in respect to the image pickup, for observing at least one of tips of probe needles of a probe card, from a side of said contact plate opposite to a side thereof facing the probe needles; and
magnification changing means operable to set the lower magnification of said image pickup means when said image pickup means is to be used to detect information which can be used to press contact said contact plate against said at least one needle tip with use of said X-Y stage and said driving mechanism, said magnification changing means being operable also to set the higher magnification when said image pickup means is to be used to observe said at least one needle tip press contacted to said contact plate, for detection of information for alignment of the probe needles with the wafer.

14. A wafer prober, comprising:
an X-Y stage for supportingly moving a wafer in X and Y directions;
a contact plate;
a driving mechanism for moving said contact plate in a Z direction relatively to said X-Y stage;
detecting means for detecting information which can be used to press contact said contact plate against at least one of tips of probe needles of a probe card with use of said X-Y stage and said driving mechanism;
first image pickup means for observing said at least one needle tip press contacted to said contact plate, from a side of said contact plate opposite from a side thereof engaged by said at least one needle tip;
second image pickup means for observing the wafer; and
processing means for processing a signal from said first image pickup means to obtain information on the basis of which said X-Y stage can be actuated so that a bonding pad of the wafer is positioned in a range of observation of said second image pickup means.

* * * * *